United States Patent [19]
Shibata et al.

[11] Patent Number: 5,594,372
[45] Date of Patent: Jan. 14, 1997

[54] SOURCE FOLLOWER USING NMOS AND PMOS TRANSISTORS

[76] Inventors: Tadashi Shibata, 19-1393, Aza-Koshizi, Nagamachi,Taihaku-ku, Sendai-shi, Miyagi-ken 980; Tadahiro Ohmi, 1-17-301, Komegabukuro 2-chome, Aoba-ku, Sendai-shi, Miyagi-ken 980, both of Japan

[21] Appl. No.: 511,495

[22] Filed: Aug. 4, 1995

Related U.S. Application Data

[63] Continuation-in-part of Ser. No. 60,362, May 11, 1993, which is a continuation of Ser. No. 777,352, Jan. 6, 1992, Pat. No. 5,258,657, and Ser. No. 87,675, Oct. 13, 1993, Pat. No. 5,469,085.

[30]     Foreign Application Priority Data

Jun. 2, 1989 [JP] Japan ................................ 1-141463
Jan. 12, 1991 [JP] Japan ................................ 3-13780
Jul. 2, 1991 [JP] Japan ................................ 3-188147

[51] Int. Cl.$^6$ ............................................. H03K 19/0948
[52] U.S. Cl. .............................. 326/121; 326/83; 326/36
[58] Field of Search ................................. 395/21; 326/35, 326/36, 112, 121, 122, 83

[56]              References Cited

U.S. PATENT DOCUMENTS

| | | |
|---|---|---|
| 2,900,531 | 8/1959 | Wallmark . |
| 3,010,033 | 11/1961 | Noyce . |
| 3,204,160 | 8/1965 | Sah .......................................... 317/235 |
| 4,652,773 | 3/1987 | Cartwright . |
| 4,654,548 | 3/1987 | Tanizawa . |
| 4,727,266 | 2/1988 | Fujii et al. . |
| 4,950,917 | 8/1990 | Holler et al. . |
| 4,951,239 | 8/1990 | Andes et al. ............................. 364/807 |
| 4,961,002 | 10/1990 | Tam et al. . |
| 4,999,525 | 3/1991 | Park et al. . |
| 5,021,693 | 6/1991 | Shima . |
| 5,028,810 | 7/1991 | Castro et al. . |
| 5,036,223 | 7/1991 | Sakai et al. . |
| 5,059,835 | 10/1991 | Lauffer et al. . |
| 5,070,256 | 12/1991 | Grondalski . |
| 5,095,230 | 3/1992 | Takai et al. . |
| 5,192,879 | 3/1993 | Aoki et al. . |
| 5,206,544 | 4/1993 | Chen et al. . |
| 5,258,657 | 11/1993 | Shibata et al. . |
| 5,469,085 | 11/1995 | Shibata et al. ............................. 326/121 |

FOREIGN PATENT DOCUMENTS

| | | |
|---|---|---|
| 52-133747 | 9/1977 | Japan . |
| 53-103371 | 8/1978 | Japan . |
| 56-19660 | 2/1981 | Japan . |
| 56-76559 | 6/1981 | Japan . |
| 57-190423 | 11/1982 | Japan . |
| 59-175770 | 10/1984 | Japan . |
| 59-221678 | 12/1984 | Japan . |
| 1-137821 | 5/1989 | Japan . |
| 1-125952 | 5/1989 | Japan . |
| 1-268313 | 10/1989 | Japan . |
| WO90/15444 | 6/1990 | WIPO . |

*Primary Examiner*—Edward P. Westin
*Assistant Examiner*—Richard Roseen
*Attorney, Agent, or Firm*—Baker & Daniels

[57]                  ABSTRACT

The NMOS and PMOS transistor both have a source and a floating gate. The source of the NMOS transistor is connected to both the source of the PMOS transistor and to an output termina. The floating gate of the NMOS transistor is connected to the floating gate of the PMOS transistor. A plurality of input gates are respectively capacitively coupled to the respective floating gates of the NMOS transistor and the PMOS transistor and are also respectively connected to a plurality of input terminals.

1 Claim, 17 Drawing Sheets $$Z = \sum_{i=1}^{n} wi Vi$$

SOURCE FOLLOWER USING NMOS AND PMOS TRANSISTORS

CROSS REFERENCE TO RELATED APPLICATIONS

This is a continuation-in-part application of U.S. patent application Ser. No. 08/060,362 filed May 11, 1993, which, in turn, is a continuation of U.S. patent application Ser. No. 07/777,352, filed Jan. 6, 1992, now U.S. Pat. No. 5,258,657, and is also a continuation of U.S. patent application Ser. No. 08/087,675, filed Oct. 13, 1993 now U.S. Pat. No. 5,469,085.

TECHNICAL FIELD

The present invention relates to a semiconductor device and in particular to a high performance CMOS circuit.

BACKGROUND OF THE INVENTION

Semiconductor integrated circuit technology has rapidly progressed. For example, in the case of dynamic memory, memory chips with a capacity of 1 though 4 Mbit have been already put into mass production and ultra large integration memory chips such as 16 Mb or 64 Mb memory are now being developed. Such ultra large integration technology is applied to a logic circuit as well as a memory circuit, and a variety of functional logic integrated circuits represented by 32 bit CPU or 64 bit CPU are also under development.

In these logic circuits, an arithmetic operation is carried out by using digital signals, i.e., binary signals composed of 1 and 0. For example, a Neumann method is adopted for a computer, where commands are executed one by one according to a predetermined program. Although simple numerical calculations can be carried out at very high speed by this method, it takes a lot of time to perform the pattern recognition or image processing. Furthermore, this method is not suitable for information processing such as association of ideas, memorizing and learning, which is mankind's strongest point. In spite of a lot of research and development activities for software technology, notable results have not been produced yet.

There has been another stream of research to get rid of these difficulties at once and then to construct a computer which imitates arithmetic operations of the brain, i.e. neuron circuit computer (neural computer) by studying brain functions of living things. This kind of research began in the 1940s and has become very active in last several years based on the fact that the progress in LSI technology may make it possible to realize the hardware of a neuron computer.

However, the present semiconductor LSI technology still has too many problems to put it into practice. This is described more concretely. For example, in order to make the hardware with the function of one human neuron cell (neuron), a circuit must be constructed by combining a lot of semiconductor elements. In other words, it is very difficult to construct the practical number of neurons on a semiconductor chip.

The main purpose of this invention is to provide a semiconductor device which realizes the function of a neuron using a single MOS type semiconductor element. Before a detailed explanation of the invention is given, the function which is required for one neuron and the difficulties associated with the construction of a neuron using current technologies are described.

FIG. 19 is a schematic representation illustrating the function of a neuron cell, i.e., neuron, which was proposed by McCumllock and Pitts as a mathematical model of neuron (Bull. Math. Biophys., Vol. 5, p. 115 (1943)). At present, the studies are being carried out actively to construct a neuron computer by realizing this model with semiconductor circuits. $V_1, V_2, V_3, \ldots, V_n$ are n input signals defined as, for example, magnitudes of voltages, and correspond to signals transferred from other neurons. $W_1, W_2, W_3, \ldots, W_n$ are coefficients representing the coupling strengths between neurons, and are biologically called synapse couplings. The function of this neuron is simple. When the value Z, linear sum of the product of each input $V_i$ and weight $W_i$ ($i=1-n$), becomes larger than a predetermined threshold value $V_{TH}^*$, the neuron outputs 1; on the other hand, 0 when Z is less than $V_{TH}^*$. The numerical expression is as follows:

$$Z = \sum_{i=1}^{n} W_i V_i \tag{1'}$$

$$V_{out} = \begin{cases} 1 \ (Z > V_{TH}^*) & (2') \\ 0 \ (Z < V_{TH}^*) & (3') \end{cases}$$

FIG. 19(b) shows the relationship between Z and $V_{out}$. The output is 1 when Z is large enough as compared with $V_{TH}^*$ and 0 when Z is small enough.

Next, an example of the circuits to realize the above-mentioned function using conventional semiconductor technology is shown in FIG. 20. In the figure, 102-1, 102-2 and 102-3 denote operational amplifiers. FIG. 20(a) shows a circuit to obtain Z by adding the product of input signal $V_i$ ($i=1-n$) and weight $W_i$. $I_i$ denotes electric current flowing through $R_i$. From $I_i = V_i/R_i$, $$I_a = \sum_{i=1}^{n} (V_i/R_i)$$

the output voltage $V_a$ of the operational amplifier 102-1 is given by $$V_a = -R \sum_{i=1}^{n} (V_i/R_i)$$

Since $I_b$ is given by $-V_a/R$, $I_a$ and $I_b$ have the same magnitude ($I_a = I_b$) and the opposite direction of flow, leading to the expression:

$$Z = R \sum_{i=1}^{n} (V_i/R_i) = \sum_{i=1}^{n} (R/R_i)V_i \tag{4'}$$

By the comparison between Eqs. (1') and (4'), the weight coefficient $W_i$ is found to be $R/R_i$ and therefore determined by the resistance. The circuit shown in FIG. 20(a) is a circuit to generate the voltage representing the linear sum of input signals obtained by summing up electric currents. FIG. 20(b) is an example of circuit to convert the value of Z into $V_{out}$, where Z is connected to a non-inversion input terminal of operational amplifier 102-3. Since an operational amplifier is an amplifier having a large voltage amplification (gain), $V_{out} = V^+$ when $Z > E_\theta$ and $V_{out} = V^-$ when $Z < E_\theta$, as shown in FIG. 20(c). Here, $V^+$ and $V^-$ are the maximum and the minimum values of outputs which are determined by power supply voltage supplied to the operational amplifier. The value of $V_{TH}^*$ can be changed by varying the voltage $E_\theta$ applied to non-inversion terminal. One of the problems of the circuit shown in FIGS. 20(a) and (b) is such that a lot of semiconductor elements are required to construct a neuron. Three operational amplifiers are used in the circuit of the figure and therefore 30 transistors are necessary since at least 10 transistors are usually required to construct one operational amplifier. And since the sum operation is made on the basis of electric current mode, a large amount of current always flows, resulting in large power dissipation. Namely, one neuron not only occupies a large area on a chip but also dissipates much power. Therefore, it is difficult to attain large scale integration. Even if large scale integration can be attained by shrinking the dimensions of transistor, it is almost impossible to construct a practical integrated circuit because of high density of the power dissipation.

Conventionally, source-follower circuits were widely used as circuits for the efficient driving of low impedance loads. Such a conventional circuit is depicted in FIG. 21. This diagram indicates a source-follower circuit comprising 1 NMOS transistor 2121 and a load resistance ($R_L$) 2122; the drive load 2123 is assumed to be $C_{out}$. If the resistance during the ON state of the NMOS transistor is assumed to be $R_{ON}$, then $V_{out}$ is calculated according to the following formula:

$$V_{out} = \frac{R_L}{R_{ON} + R_L} V_{DD} \quad (1)$$

Herein, $R_{ON}$ is a resistance determined by the gate source differential voltage $V_{GS}$ ($=V_{in}-V_{out}$). $R_L$ is set to a sufficiently high value, and when $R_L \gg R_{ON}$, formula (1) is simplified to $V_{out}=V_{DD}$; however, in actuality, when $V_{out}$ approaches $V_{in}$, and the state shown in the formula:

$$V_{GS}=V_{in}-V_{out} \approx V_T$$

($V_T$ indicates the threshold value of the NMOS transistor) is reached, the NMOS transistor changes to the OFF state, so that $R_{ON}$ rapidly reaches a high value. That is to say, the situation is as shown in the following formula:

$$V_{in}-V_{out} \approx V_T$$

that is to say $$V_{out}=V_{in}-V_T \quad (1)$$

is reached, and the output settles at a certain value. Even if $V_T$ is set equal to 0, $V_{out}$ will be equal to $V_{in}$, and the transistor acts as a linear amplifier of voltage gain 1. In order to rapidly charge a large load capacitance $C_{out}$, it is preferable to obtain a sufficiently large W/L of the transistor. (W indicates channel width, while L indicates channel length).

At this time, the gate capacitance of the MOS transistor is Cox·L·W, and increases in proportion to the product of L and W. (Cox indicates the capacitance with respect to a surface area unit of the gate). However, the voltage placed on both ends of the gate oxide film is essentially 0, so that the charge stored in this gate capacitance is, in actuality, 0, and accordingly, the effective input capacitance of the circuit of FIG. 21 seen from $V_{in}$ is essentially 0. That is to say, even if a large load capacitance (low impedance load) is carried on the output side of the circuit of FIG. 21, only a very small capacitance is apparent from the input side (the $V_{in}$ side) (high input impedance), so that such a circuit type has been widely known as an impedance conversion circuit. Such a circuit is extremely convenient for driving a large capacitance.

The threshold value of the NMOS transistor is set to $V_T=0$, and when a fixed positive voltage $V_{in}$ is inputted into the circuit of FIG. 21, a fixed potential output $V_{out}=V_{in}$ is maintained.

When this is done, a current $$I_n=V_{out}/R_L \quad (2)$$

is caused to flow in this circuit, and power equalling $V_{out}^2/R_L$ is consumed. In order to reduce this consumption current, $R_L$ must be increased. Here, if the input voltage changes from the positive fixed value $V_{in}$ to 0, then the change in $V_{out}$ at this time is approximately as shown in FIG. 22; it decreases at time constant $R_L \cdot C_{out}$, and approaches 0. That is to say, the time period in which the output level conforms to the input and changes to the low potential side shortens in proportion to $R_L$. That is to say, in order to increase the speed of the circuit, it is preferable that the $R_L$ be as small as possible.

However, when $R_L$ is reduced, as is clear from formula (2), the current value at the time at which the fixed voltage is maintained is increased, and the consumption current increases. Moreover, as can be understood from formula (1), the level of $V_{out}$ is lowered, and at $R_{ON} \gg R_L$, $V_{out}$ is approximately equal to 0. That is to say, the effect of this is to reduce the voltage gain of the amplifier of FIG. 21 in a striking manner.

The present invention was created in order to solve the problems stated above; it has as an object thereof to provide a semiconductor device which makes possible almost zero steady state consumption power of the source-follower circuit, is moreover capable of being operated at high speed, and is further accompanied by no reduction at all in voltage gain.

SUMMARY OF THE INVENTION

A semiconductor device of the present invention comprises a MOS type semiconductor element having a gate electrode being electrically floated and a plurality of input gate electrodes capacitively coupled with said gate electrode, wherein the channel is formed under said gate electrode being electrically floated only when the absolute value of a value obtained by linearly summing up the weighted voltages applied to said input gate electrodes becomes larger than a predetermined threshold value.

The present invention further discloses a semiconductor device comprising plural n-channel MOS transistors, and p-channel MOS transistors, wherein the sources of a first n-channel MOS transistor and a first p-channel MOS transistor are connected, the gate electrode of this first n-channel MOS transistor and the gate electrode of the first p-channel MOS transistor are connected, and the drain of the first n-channel MOS transistor has a higher electric potential than the drain of the first p-channel MOS transistor.

By means of the above semiconductor device, a source follower circuit can be realized which has a voltage gain which is essentially equal to 1, and it is possible to reduce the consumption of power during the maintenance of a fixed potential to essentially 0. Furthermore, a circuit can be realized which responds at exceedingly high speed to changes in potential.

BRIEF DESCRIPTION OF THE DRAWINGS

FIG. 1 shows schematic diagrams explaining embodiment 1.

FIG. 2 shows schematic diagrams explaining embodiment 2.

FIG. 5 shows schematic diagrams explaining embodiment 5.

FIG. 8 shows diagrams explaining embodiment 7.

FIG. 13 shows schematic diagrams explaining embodiment 9.

FIG. 19 shows diagrams explaining prior art.

Figure 1A:
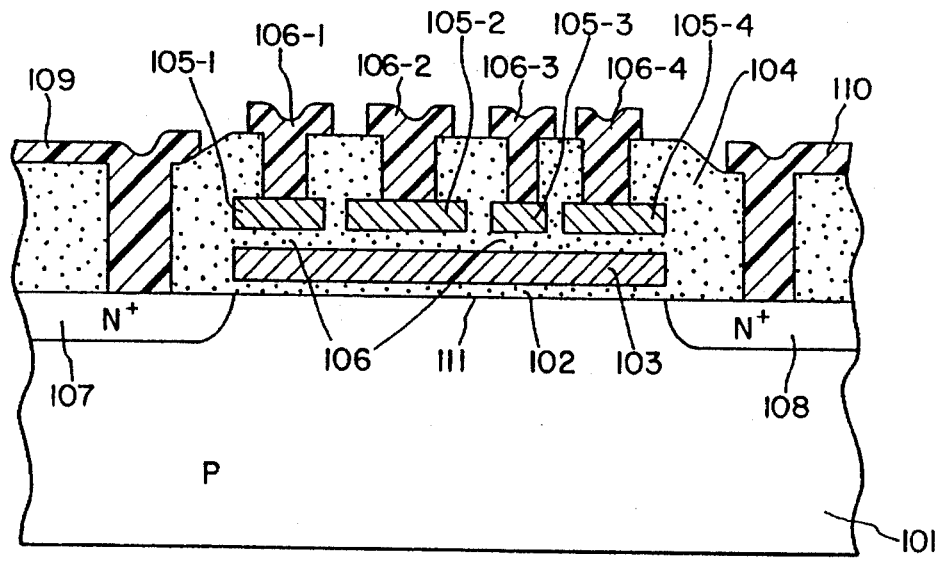
FIG. 1(a) is a cross-sectional view of a device.

A list of parts and numerals shown in the drawings is as follows: 102-1, 102-2, 102-3, arithmetic amplifier (operational amplifier); 101, P-type Si substrate; 102, gate oxide film; 103, gate electrode; 104, insulating film; 105-1–105-4, gate electrode; 106, insulating film; 106-1–106-4, Al interconnect; 107, source; 108, drain; 109, Al interconnect; 111, surface of silicon substrate; 201, floating gate; 202, gate oxide film; 203, floating gate; 204, insulating film; 205-1–205-4, input gate; 206, insulating film; 206-1–206-4, Al interconnect connected to input gate; 207, source; 208, drain; 209, 210, Al interconnect; 301, neuron element; 303, input terminal for signal voltage; 304, output terminal; 305, input terminal for control signal X; 401-1, 401-3, 401-5, input gate; 402, insulating film; 403, floating gate; 404, thermal oxidation film; 405, P-type Si substrate; 406, field oxide film; 407, Al interconnect; 501, field oxide film; 502, source; 503, drain; 504, floating gate; 505, input gate; 603, floating gate; 604, input gate; 605, control gate; 606, oxide film; 607, gate oxide film; 608, oxide film; 701, mode MOS transistor; 702, N-channel enhancement mode transistor; 801, N-channel νMOS; 802, P-channel νMOS; 803, P-type substrate; 804, N-type substrate; 805, floating gate; 806, 807, gate insulating film; 808-1–808-4, input gate; 809, source; 810, drain; 811, source; 812, drain; 813, 814, 815, Al interconnect; 816, insulating film under Al interconnect; 817, 817', 817'', 817''', contact hole; 818, insulating film; 901, C-νMOS; 902, CMOS inverter; 1001, NMOS; 1201, 1202, input gate; 1203, floating gate; 1401, C-νMOS; 1402, source; 1403, CMOS inverter; 1404, source; 1405, p-MOSFET; 1406, n-MOSFET; 1501, νMOS; 1602, 1603, inverter.

DESCRIPTION OF THE PREFERRED EMBODIMENT OF THE INVENTION

Embodiment 1

FIG. 1 is a cross-sectional view of a semiconductor device according to embodiment 1. A gate electrode 103 made of n+ polysilicon is formed over a p-type Si substrate 101 through a gate oxide film 102. Surrounded by insulating film 104 such as $SiO_2$, this gate electrode is left in an electrically floating state.

Input gate electrodes 105-1–105-4 made of, e.g., n+ polysilicon are isolated from floating gate 103 by an insulating film 106 such as $SiO_2$. The potential of these input electrodes is determined by the voltage supplied through Al interconnects 106-1–106-4.

107 and 108 are a source and a drain, respectively, which are, for example, formed by ion-implanting an As ion. 109 and 110 are interconnects connected to the source and the drain, respectively. The semiconductor device of this invention has the following function: when the linear sum of the products of the voltages $V_1, V_2, V_3, V_4$ applied to the gate electrodes 105-1 to 105-4 and corresponding weights exceeds a predetermined threshold value, an inversion layer (i.e., channel) is formed on the silicon substrate surface 111, and the source and the drain are electrically connected together. A detailed explanation about the linear sum operation of voltages of the device is described below.

Figure 1B:
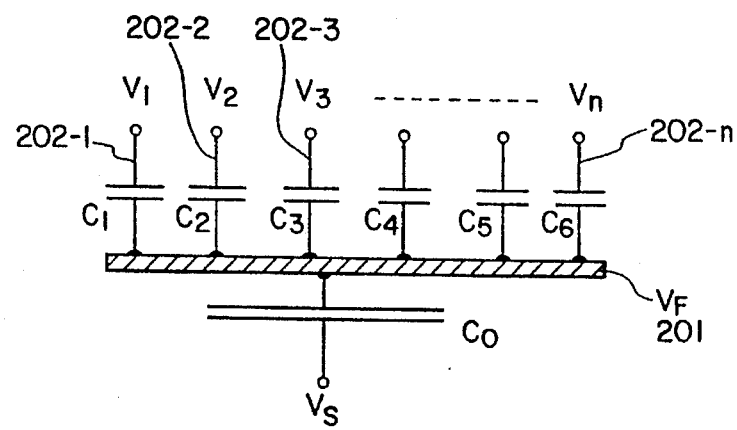
FIG. 1(b) is an equivalent circuit of the device.

First, the discussion is made on the device of FIG. 1(a) using, a generalized model shown in FIG. 1(b). 201 denotes a floating gate, corresponding to 103 in FIG. 1(a). This model is generalized to have n control gates 202-1, 202-2, 202-3, ..., 202-n based on the case of FIG. 1(a) having four control gates 105-1, 105-2, 105-3 and 105-4. $C_1, C_2, C_3, ... C_n$ denote the capacitive coupling coefficients (capacitance) between the floating gate and respective gates. $C_\theta$ is the capacitance between the floating gate and the substrate 101.

Now, symbols are defined as follows: $V_F$ is the potential of the floating gate, $V_1, V_2, V_3, \ldots V_n$ are the voltages supplied to respective input gates and $V_\theta$ is the potential of the substrate. Let $Q_1, Q_2, Q_3, \ldots$ and $Q_n$ denote charges stored in the capacitances $C_1, C_2, C_3, \ldots$ and $C_n$ which are obtained as $Q_\theta = C_{\theta(V\theta} - V_F)$, $Q_1 = C_1 (V_1 - V_F)$, $Q_2 = C_2 (V_2 - V_F), \ldots$ and $Q_n = C_n (V_n - V_F)$. Namely, total charge $Q_F$ in the floating gate is given by $$Q_F = \sum_{i=0}^{n} (-Q_i)$$

$$= \sum_{i=0}^{n} C_i (V_i - V_F)$$

$$= \sum_{i=0}^{n} C_i V_i + V_F \sum_{i=0}^{n} C_i$$

Therefore, $V_F$ is obtained as the following expression.

$$V_F = \left( \sum_{i=0}^{n} C_i V_i + Q_F \right) / C_{TOT} \quad (1)$$

where $$C_{TOT} = \sum_{i=0}^{n} C_i$$

The device shown in FIG. 1(a) can be regarded as a MOSFET having a threshold voltage of $V_{TH}$ in which the floating gate 103 works as a gate electrode thereof. In other words, a channel is formed on the substrate surface 111 when the potential of the floating gate 103 becomes $V_{TH}$ volt. For the case $V_F > V_{TH}$, Eq. (1) is written as $$Z \equiv \sum_{i=0}^{n} W_i V_i > V_{TH} - C_\theta / C_{TOT}) V_\theta - Q_F / C_{TOT} \quad (2)$$

where $$W_i = C_i / C_{TOT}$$

Eq. (2) means that when the value of the linear sum of all input voltages to the gates 202-1, 202-2, 202-3, . . . and 202-n weighted by $W_1, W_2, W_3, \ldots$ and $W_n$ becomes larger than $V_{TH}$ given by Eq. (3), the device turns on and the source and the drain are connected.

$$V_{TH}^* = V_{TH} - (C_\theta / C_{TOT}) V_\theta - Q_F / C_{TOT} \quad (3)$$

Here, usually, the substrate is grounded, that is, $V_\theta = 0$, and the total charge in the floating gate is 0. Then, $$T_{TH}^* = V_{TH}. \quad (4)$$

As mentioned above, the semiconductor device of this invention has the function to calculate the weighted linear sum of all input signals and to control the on and off of the MOS transistor based on the comparison between the results of the weighted sum and the threshold $V_{TH}$. In other words, this device is quite a new transistor with which a high arithmetic operation function is realized in a single element level. Thus, this device is very suitable for constructing a neuron computer which will be described later. For this reason, this transistor is called neuron transistor or √ (neu) MOS in short.

Figure 1C:
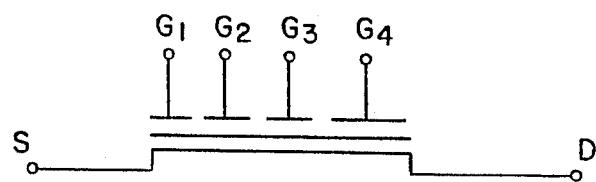
FIG. 1(c) is a schematic diagram of circuit.

FIG. 1(c) shows a symbol for √MOS, where S is a source, D is a drain and $G_1, G_2, G_3$ and $G_4$ are gates.

Figure 1D:
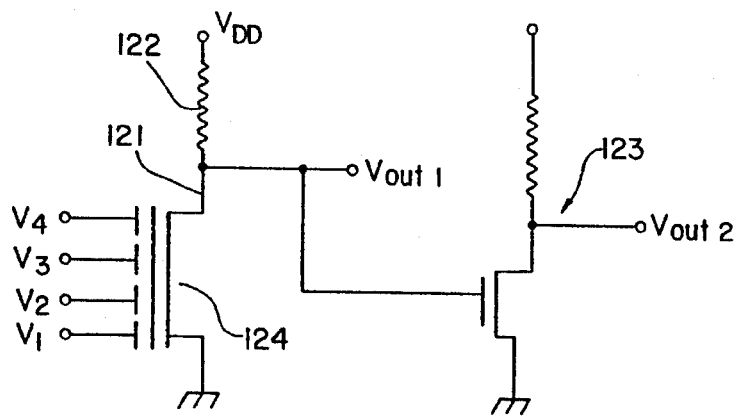
FIG. 1(d) is another example of circuit.
Figure 1E:
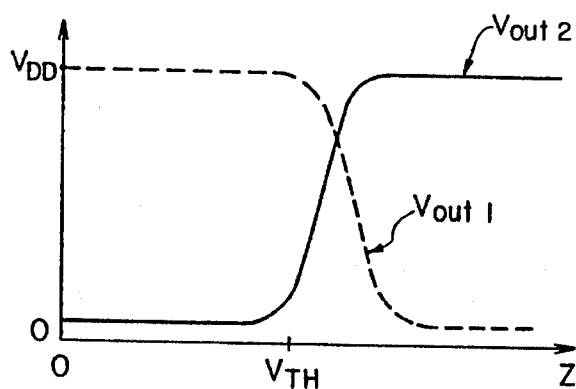
FIG. 1(e) is a graph showing characteristics.
Figure 19A:
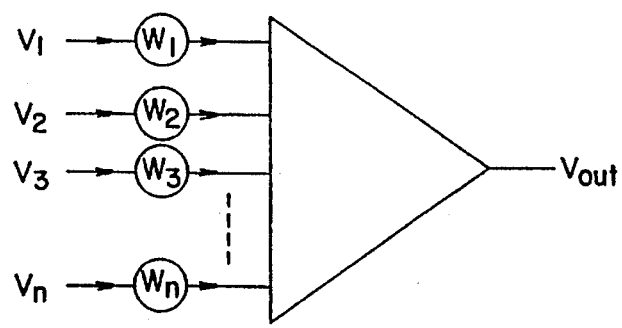
FIG. 19(a) is a schematic diagram and FIG. 19(b) is a graph showing characteristics.
Figure 19B:
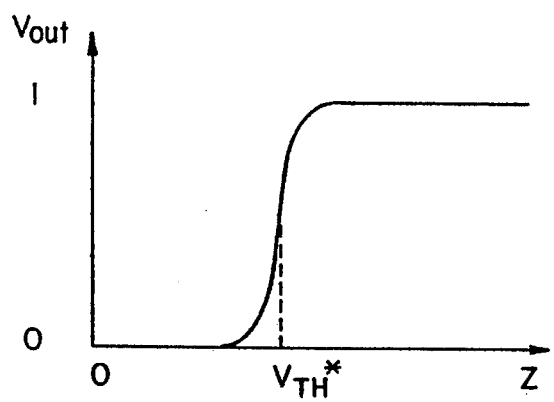
Figure 20A:
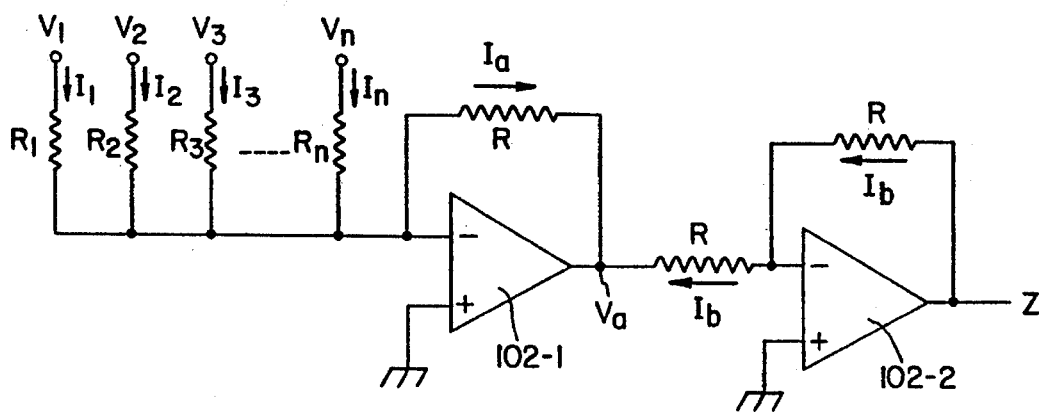
FIG. 20 is a diagram of a circuit explaining prior art.
Figure 20B:
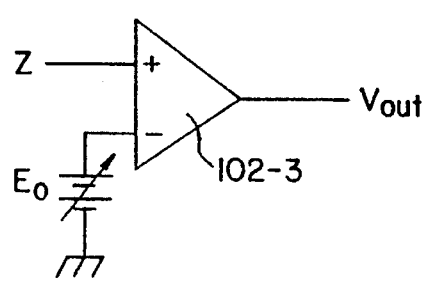
Figure 20C:
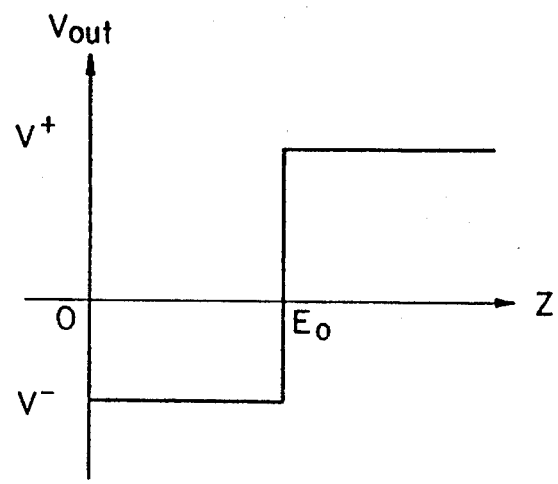
Figure 21:
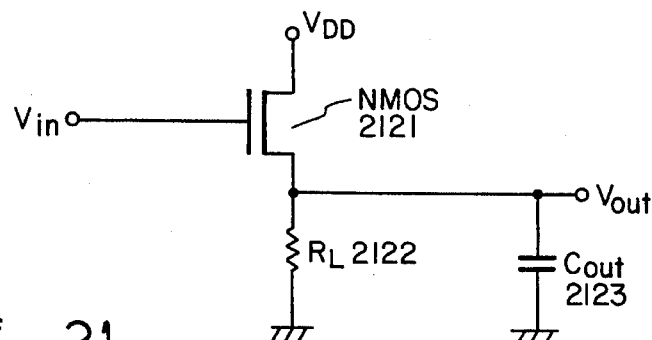
FIG. 21 is a conceptual diagram showing a conventional source follower circuit.
Figure 22:
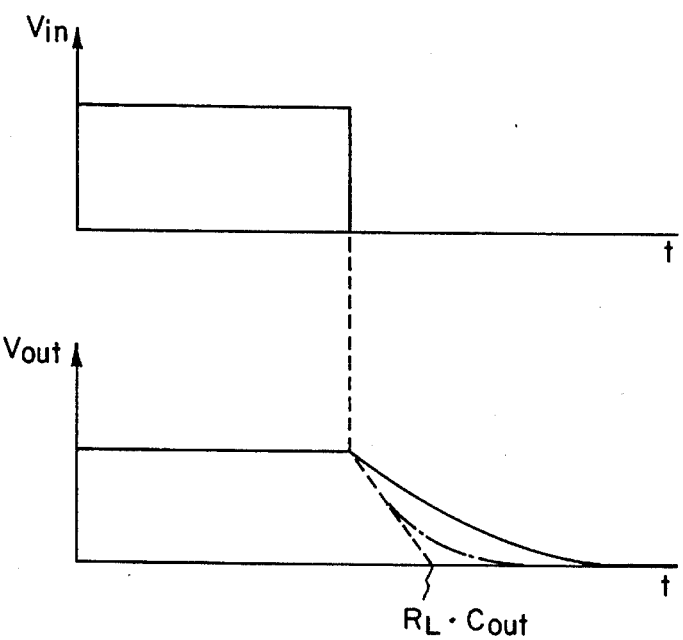
FIG. 22 is a graph showing the response characteristics of output voltage in a conventional source follower circuit.

The structure of a neuron element is described in FIG. 1(d) using symbols. This is another example of the embodiment. A drain 121 of √MOS is connected to a power supply line ($V_{DD}$) through a load 122. When $Z = W_1 V_1 + W_2 V_2 + W_3 V_3 + W_4 V_4$ in this circuit, the relation between $V_{out1}$ and $Z$ is shown by the broken line of FIG. 1(e). In the case where $V_{out}$ is connected to an ordinary inverter 123, the output $V_{out2}$ is shown by the solid line of FIG. 1(e). That is to say, the function of one neuron shown in FIG. 19(a) is realized by using this simple circuit. The effect of this invention is definitely understood from the comparison of FIG. 1(d) with FIGS. 20(a) and 20(b) representing the prior art: only two MOS transistors are required to construct one neuron in this invention while at least 30 transistors are required in the prior art. In other words, it first becomes possible to lessen the area on a chip by more than one order and therefore realize ultra large scale integration. Furthermore, in the prior art, the circuit is constructed with bipolar transistors which conduct large current and the sum operation is made by utilizing current additivity, resulting in large power dissipation. On the other hand, constructed with only two MOS transistors in this invention, the circuit dissipates very little power. An MOS is, by nature, a voltage-controlled device which can control the on and off with a slight amount of charge. Therefore, the power dissipation is very little. In addition, because of √MOS having the function of direct sum of input voltages, the circuit does not require the conversion operation from voltage into current for sum operation, unlike the case in FIG. 20(a) where sum operation is made after the voltages are converted into currents, suggesting that this neuron is capable of low power dissipation operation. For these reasons; high integration density and low power dissipation, it becomes possible for the first time to construct the circuit which can be used for a neuron computer at practical use level.

Figure 1F:
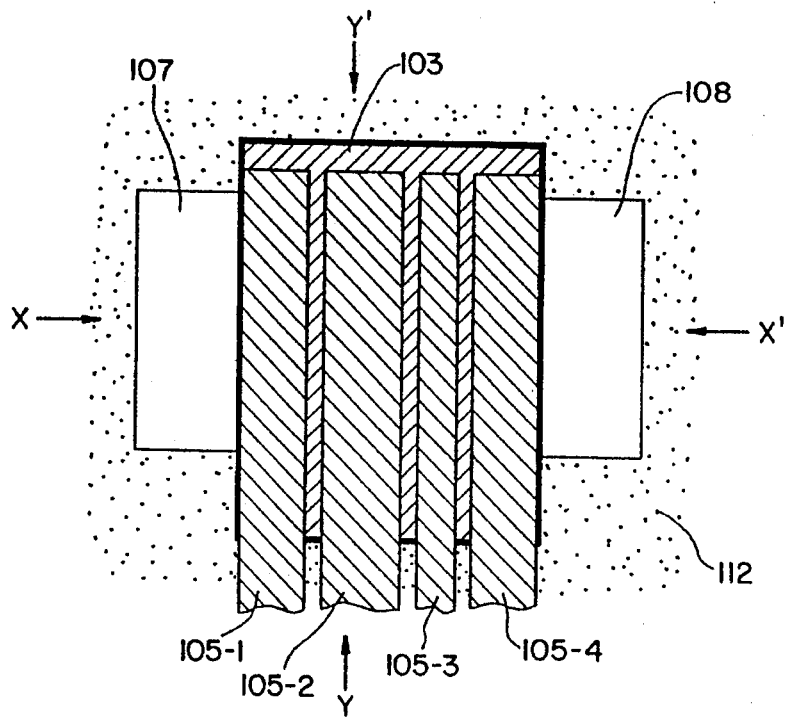
FIG. 1(f) is a plan view of a device and FIG. 1(g) is a cross-sectional view along Y-Y' line of FIG. 1(f).

FIG. 1(f) is a plan view of √MOS shown in FIG. 1(a). In this figure, the same numerals are used as those in FIG. 1(a): 107 and 108 are a source and a drain, 105-1 to 105-4 are four input gates and 103 is a floating gate. The cross-section along X-X' line corresponds to FIG. 1(a). Here, however, an insulating film 104, aluminum interconnects 109, 110, 106-1–106-4 are omitted to easily understand the drawing. These parts are formed at appropriate sites.

Figure 1G:
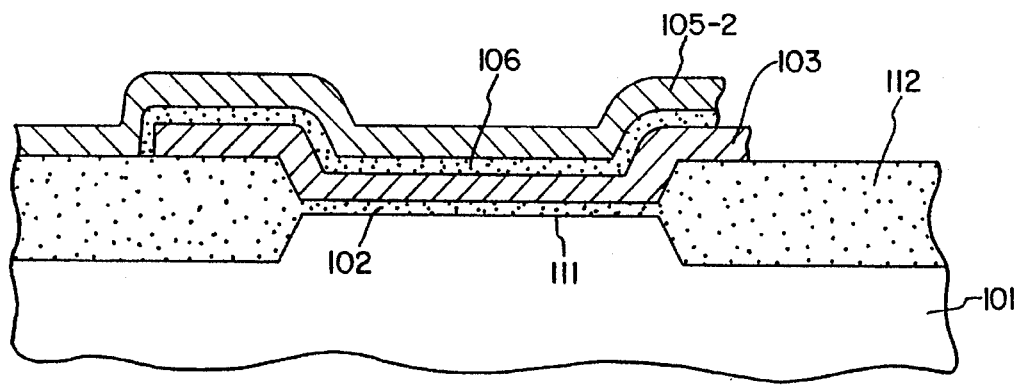

FIG. 1(g) is a cross-sectional view along Y-Y' line of FIG. 1(f). Common numerals are also used in the figure. Here, 112 is a field oxide film to isolate elements.

Next, a concrete example of how to prepare elements is described. In the embodiment shown in FIGS. 1(a), 1(f) and 1(g), a P-type substrate with (100) plane and a specific resistance of 0.5 Ω.cm was used, and each parameter, is designed as follows: the thickness of the gate oxide film ($SiO_2$) is 500 Å, that of the insulating film ($SiO_2$) between the floating gate and the input gates is 500 Å, the overlapping area between the floating gate and the channel forming region is 3 μm×3.5 μm, and those between the floating gate and input gates 105-1, 105-2, 105-3 and 105-4 are 4 μm×0.75 μm, 4 μm×1.0 μm, 4 μm×0.5 μm and 4 μm×0.75 μm, respectively. Since the field oxide film is thick, for example, about 1 μm, capacitances of the regions where the field oxide film is put between the floating gate 103 and the substrate 101, or between the control gate 105 and the substrate 101 are so small as to be neglected. Calculation based on such data gives $$C_\theta : C_1 : C_2 : C_3 : C_4 = 10.5 : 3 : 4 : 2 : 3$$

and $$Z = 0.13 V_1 + 0.18 V_2 + 0.089 V_3 + 0.13 V_4 \quad (5)$$

If $V_3 = 0$ and no charge injection into the floating gate is assumed to occur, $V_{TH}^*$ becomes about 1.0 V from Eq. (4).

In the case of $V_1=0$ V, $V_2=5$ V, $V_3=5$ V and $V_4=5$ V, $Z=2.0$ V and $V_{out2}$ in FIG. 1(d) becomes 5 V. And in the case of $V_1=0$ V, $V_2=0$ V, $V_3=5$ V and $V_4=0$ V, $Z=0.45$ V and $V_{out2}$ becomes about 0 V (low level). Although only the cases of input signals being either 0 or 5 V are discussed, it is also possible for the cases of input values being intermediates between 0 and 5 V or negative values. Furthermore, $V_{out2}$ is used as output of this neuron, but the inversion output $V_{out1}$ can also be used directly as output.

Embodiment 2

Figure 2A:
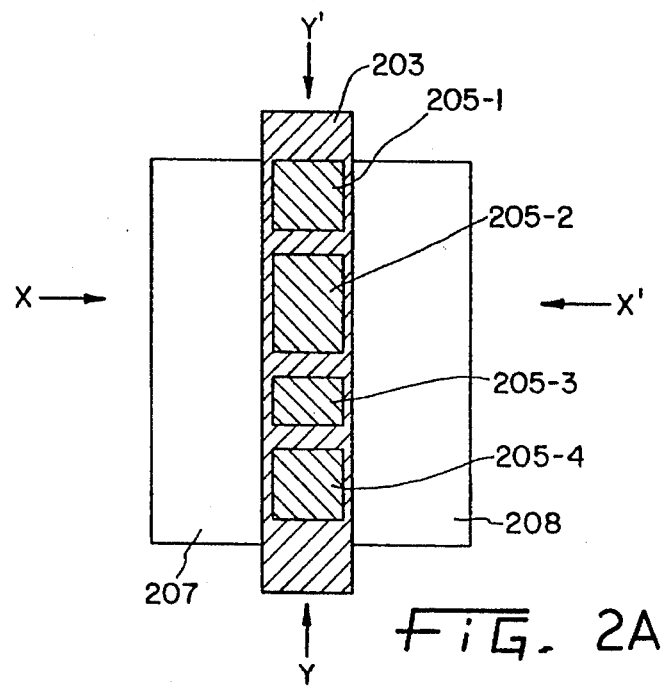
FIG. 2(a) is a plan view of a device.
Figure 2B:
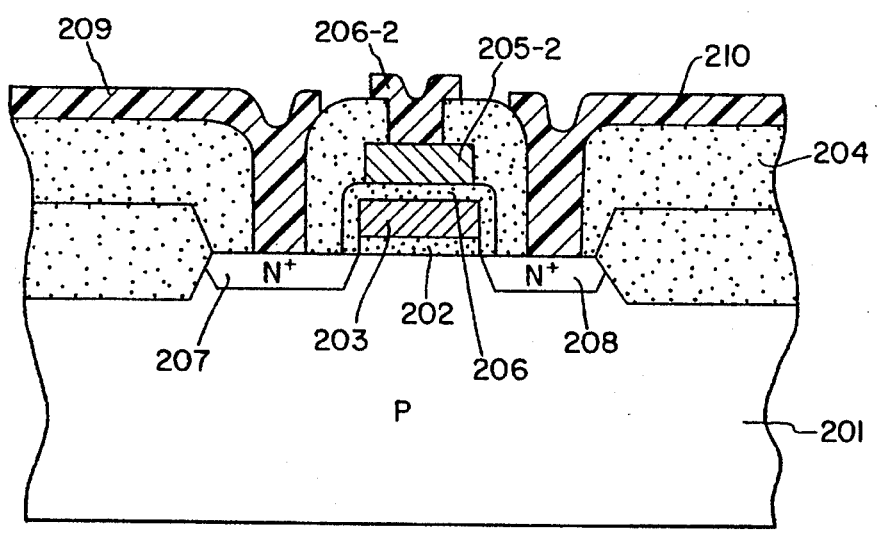
FIG. 2(b) is a cross-sectional view along X-X' of FIG. 2(a) line and FIG. 2(c) is a cross-sectional view along Y-Y' line of FIG. 2(a).
Figure 2C:
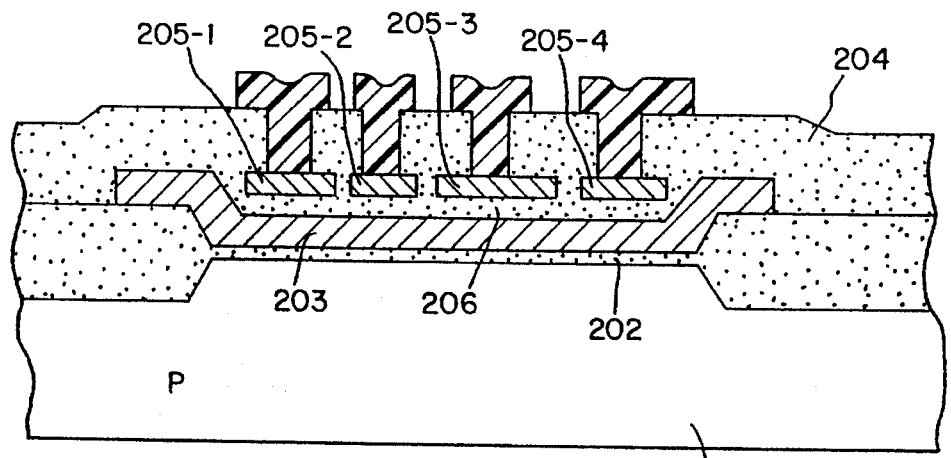

As is apparent from FIG. 1(f), in the embodiment 1 shown in FIGS 1(a), 1(f) and 1(g), a channel length of νMOS inevitably becomes long since input gates are aligned along the channel, i.e., X-X' direction. This is unsuitable for high speed operation. So, the second embodiment which make it possible to shorten a channel of νMOS is described. FIG. 2(a) is a plan view. FIGS. 2(b) and 2(c) are cross-sections along X-X' and Y-Y' lines of FIG. 2(a), respectively. Al interconnects and interlayer insulating films are omitted in FIG. 2(a) for simplicity. 201 is, for example, a P-type substrate, 207 and 208 are a source and drain, respectively, 202 is a gate oxide film, 203 is a floating gate, 205-1 to 205-4 are input gates, 206-1 to 206-4 are Al interconnects connected to input gates, 209 and 210 are Al interconnects connected to the source and the drain, respectively, 206 is an insulating film between the floating film and input gates, and 204 is an insulating film under Al interconnects. When MOS is designed in such a manner that the overlapping area between the floating gate and the channel forming region is 1 μm×4 μm, those between the floating gate and input gates 205-1, 205-2, 205-3 and 205-4 are 1 μm×0.75 μm, 1 μm×1 μm, 1 μm×0.5 μm and 1 μm×0.075 μm, respectively, and the other parameters are the same as those in FIG. 1(a), Z is given by $$Z=0.107V_1+0.143V_2+0.071V_3+0.107V_4 \quad (6)$$

Here, $V_1$, $V_2$, $V_3$ and $V_4$ denote applied voltages to input gates 205-1, 205-2, 205-3 and 205-4, respectively. If the circuit shown in FIG. 1(d) is constructed using such a transistor, $Z=1.78$ and $V_{out2}=5$ V in the case of $V_1=5$ V, $V_2=5$ V, $V_3=0$ V and $V_4=5$ V; on the other hand $Z=0.99$ and $V_{out2}=0$ V in the case of $V_1=0$ V, $V_2=0$ V, $V_3=5$ V and $V_4=5$ V. These results apparently mean that this circuit can perform neuron operation.

In the embodiments 1 and 2, the weight by which the input voltage is multiplied is determined by the ratio of capacitance $C_i$ ($i=1-4$) of overlapping region between the floating gate and the input gate to total capacitance.

$$C_{TOT}= \sum_{i=1}^{4} C_i$$

Thus, it is possible to change the weight freely by varying the overlapping area between the floating gate and the input gate. The capacitance can also be changed by employing other materials of insulator formed between the floating gate and the input gates, i.e., by varying dielectric constant of insulator. For example, the capacitance ratio becomes about 1:2:2.3 for $SiO_2$: $Si_3N_4$: $Al_2O_3$ even if the overlapping area is equal. As a matter of course, a large ratio can be obtained by changing both the overlapping area and material. In order to obtain larger capacitive coupling coefficient with especially small area, that is, in order to obtained especially large weight coefficients $W_i (i=1-4)$, materials with large dielectric constant such as $Ta_2O_6$ are used. The weight is about five times as large in this case as that in the case where $SiO_2$ with the same overlapping area is used. Furthermore, changing the insulating film thickness can also cause the change in capacitance, i.e., weight coefficient.

Embodiment 3

Figure 3:
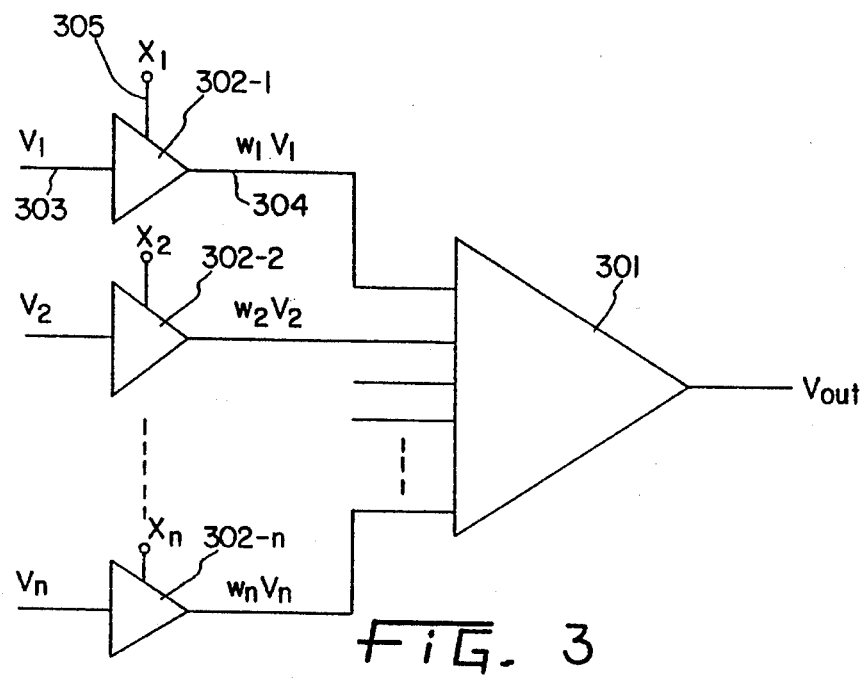
FIG. 3 is a block diagram explaining embodiment 3.

In the embodiments 1 and 2 mentioned above, the weight coefficients ($W_1$–$W_4$) by which input signals are multiplied are determined by the νMOS structure and therefore cannot be changed after the element is constructed. The third embodiment of the present invention shown in FIG. 3 is a neuron which makes it possible to freely change the weight coefficients even after the element is constructed. 301 is a neuron element, composed of e.g., a circuit shown in FIG. 1(d). Other neuron elements are also used which will be described in other embodiments using FIGS. 4, 5, 6, and 8. 302-1, 302-2, 302-n are circuits to output the values of input signal voltage $V_1$, $V_2$, ... $V_n$ weighted by $W_1$, $W_2$, $W_n$. The circuit 302-1, for example, has at least three terminals 303, 304 and 305. 303 is an input terminal for signal voltage. 304 is a terminal to output the product $W_1V_1$ of input voltage $V_1$ and the weight $W_1$. The third terminal 305 is a input terminal for control signal $X_1$, the magnitude of which changes the weight $W_1$.

In other words, with this circuit configuration, the weight by which the input signal to the neuron element 301 is multiplied can freely be varied. This is very important in realizing a neuron computer because such weight coefficients momentarily change to carry out arithmetic operations in the biological information processing. Living things carry out sophisticated information processing such as recognition, association of idea and learning by varying such weights one after another based on the arithmetic operation. Namely, the structure of FIG. 3 is a most fundamental structure of a neuron computer. The weight-product circuits 302-1, 302-2, ... 302-n will be discussed in detail later.

Since weighting input signals is carried out by the weight-product circuit in the structure of FIG. 3, the device 301 is not required to change the weights by changing the overlapping area between the floating gate and the input gate, unlike the example shown in FIGS. 1 and 2. This means that the device can be designed in such a manner that all the overlapping area are equal, leading to versatility of device. It is of course possible to determine the weight coefficients by using the variation of the area, material or thickness of insulating film. together with using weight-product circuit.

Figure 4:
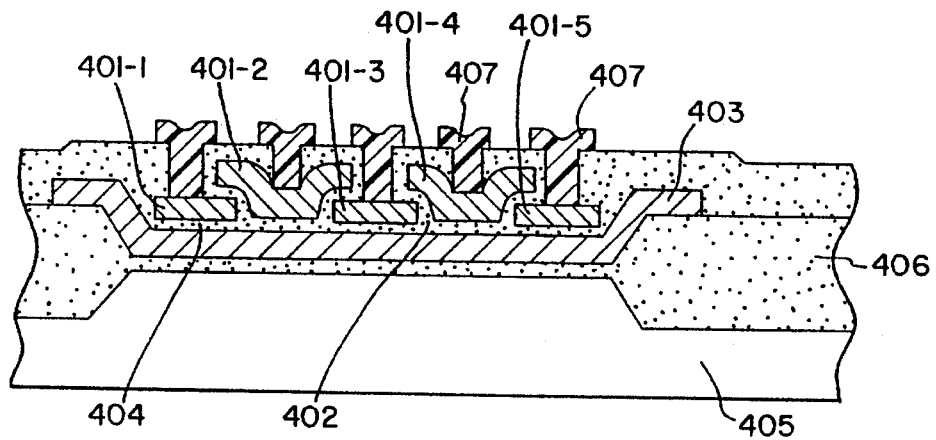
FIG. 4 is a cross-sectional view of a device explaining the embodiment 4.
Figure 5A:
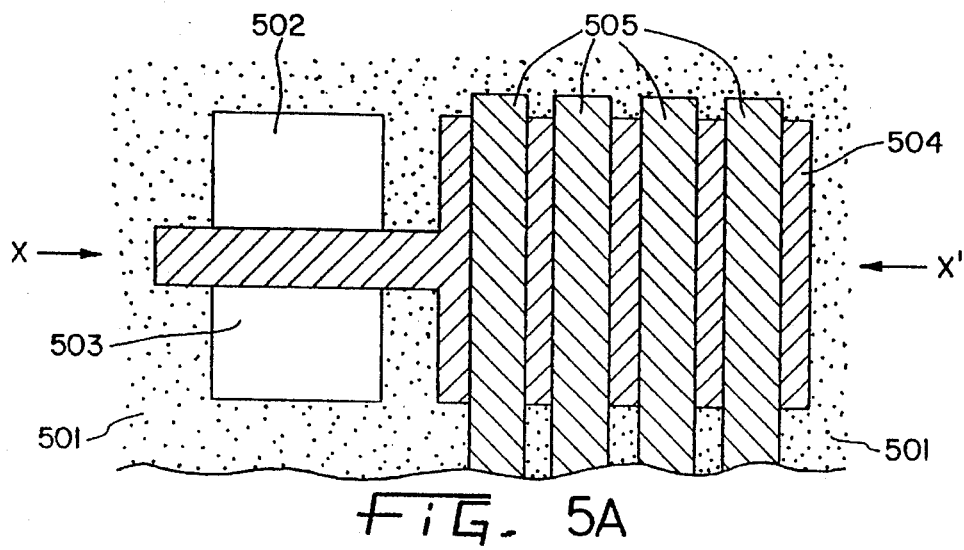
FIG. 5(a) is a plan view of a device and FIG. 5(b) is a cross-sectional view along X-X' line of FIG. 5(a).
Figure 5B:
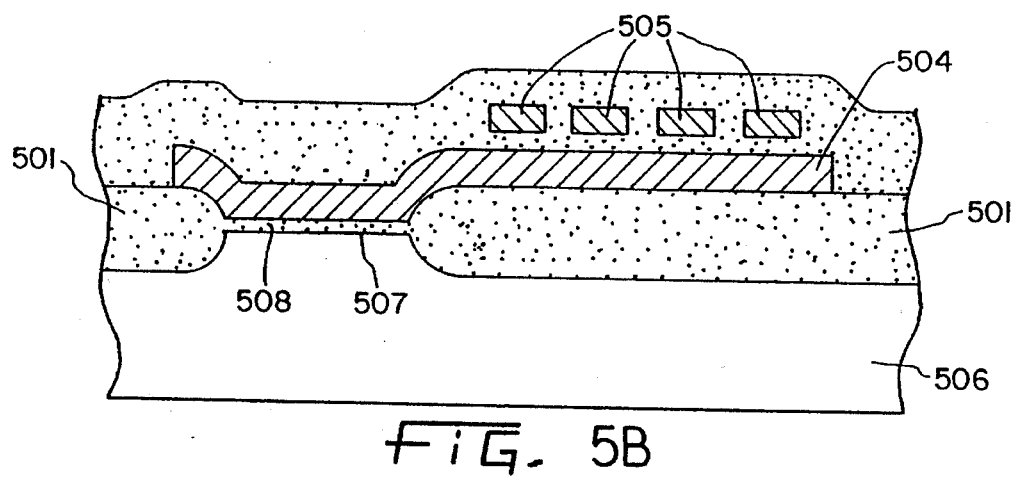
Figure 6:
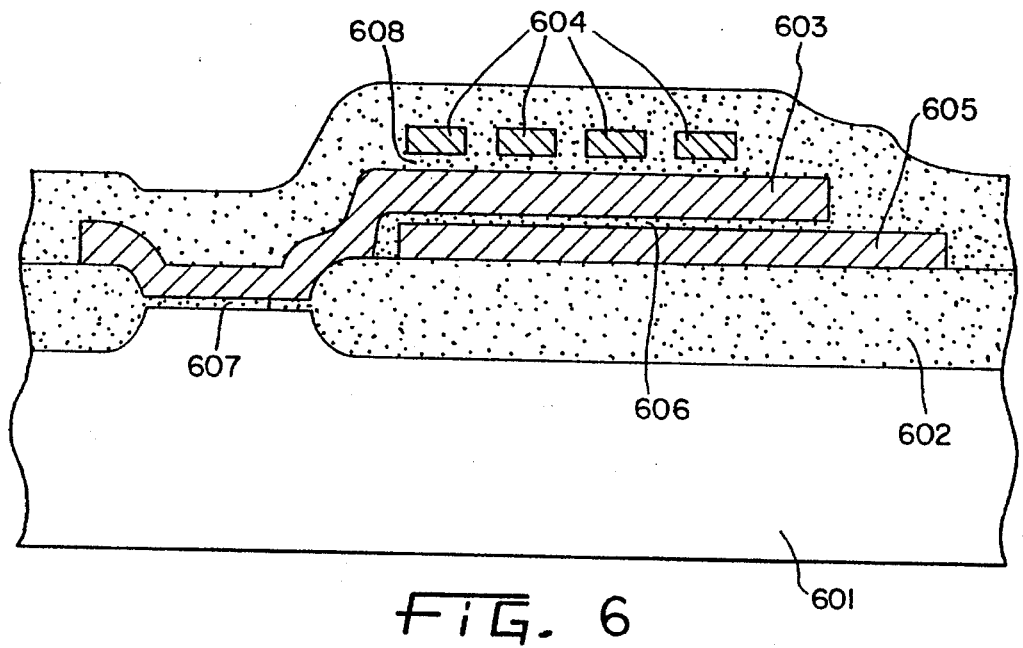
FIG. 6 is a cross-sectional view of a device explaining embodiment 6.

FIGS. 4 to 6 are diagrams to explain the embodiments 4 to 6 illustrating the structure of various νMOS in which every overlapping area is equal.

Embodiment 4 and 5

In embodiments shown in FIG. 4, the gaps between adjacent input gates of 205-1 to 205-4 are designed to be small as compared with those of the embodiment 2 (FIG. 2) so that elements with smaller dimension can be realized. That is, in FIG. 2(c), the gap between input gates is determined by the resolution limit of lithographic process, but in the embodiment of FIG. 4 the input gate are formed partially one upon another and the gaps between adjacent input gates are equal to the thickness of the insulating film 402. This structure is constructed as follows. First, a floating gate 403 is formed. Next, an insulating film 404 such as a thermal oxidation film 401 and then input gates 401-1, 401-3 and 401-5 are formed on the surface of the floating gate 403.

Then an insulating film is formed on these input gate surfaces. Finally, input gates 401-2, 401-4 are formed thereon. In the figure, 405, 406 and 407 denote a P-type Si substrate, a field oxide film and an Al interconnect, respectively.

FIG. 5 shows schematic diagrams explaining the embodiment 5. FIGS. 5(*a*) and 5(*b*) are a plan view and a cross-sectional view along X-X' line, respectively. 501 is a field oxide film region. 502 and 503 are a source and a drain regions. Al interconnects are omitted in the figure for simplicity. The feature of this embodiment is that the coupling between the floating gate 504 and input gates 505 is made on the surface of the field oxide film. In this structure, the overlapping area between the floating gate and each of input gates can be determined, regardless of the overlapping area between the floating gate and silicon substrate. Namely, since each portion of MOS transistor and coupling between the floating gate and input gate can be designed independently, the room for design choices of element becomes large. For example, if designed as $$C_1+C_2+C_3+C_4 \gg C_\theta$$

then $$C_{TOT} \approx C_1+C_2+C_3+C_4$$

and the following equation is obtained:

$$W_1+W_2+W_3+W_4 \approx 1. \quad (7)$$

The value of $W_1+W_2+W_3+W_4$ in the embodiments 1 and 2 are respectively 0.529 and 0.428; that is, less than 1. In other words, each value of weights can be made large by this embodiment.

When Eq. (4) was derived from Eq. (3), the potential $V_s$ of the substrate was assumed to be 0 V. This assumption is approximately correct, but strictly incorrect. The reason is described below. When the channel is formed on the semiconductor substrate surface 111 in FIG. 1(*a*), the potential of the channel becomes 0 V at the edge of the source region and gradually approaches to the drain potential as the position gets near the drain region. A large potential drop takes place in the vicinity of the drain region, so it is good approximation to assume the potential of whole channel to be about 0 V. Nevertheless, when a transistor comes to have a short channel, this assumption leads to error. And if the channel is formed on the silicon surface 111, the capacitive coupling coefficient $C_\theta$ between the floating gate and the Si substrate becomes nearly equal to a capacitance of gate oxidation film $C_{ox}$ which is given by $C_{ox}=\epsilon_0\epsilon_r S/t_{ox}$. Here, $\epsilon_0$ denotes vacuum dielectric constant, $\epsilon_r$ relative dielectric constant, and S the area of channel. However, when no channel appears, the depletion layer is formed on the silicon surface and $C_\theta$ is expressed as a series combination of $C_{ox}$ and a capacitance of $C_D$ of the depletion layer, i.e., $C_\theta=(1/C_{ox}+1/C_D)^{-1}$. Here, $C_D=\epsilon_0\epsilon_r^1 S/W$. $\epsilon_r^1$ denotes the dielectric constant of Si and W denotes the thickness of the depletion layer. $C_\theta$ changes as W changes with voltage difference between the floating gate and the substrate. Therefore, the value of $C_\theta V_\theta$ in Eq. (3) does not remain constant, but changes depending on the operation condition of the device. Namely, the threshold value $V_{TH}$ given by Eq. (3) changes with this value. In general, this change causes little problem because of being small as compared with $V_{TH}$. However, it is desirable for high accuracy operation that $V_{TH}$ does not change at all. On the other hand, the inequality $C_\theta \ll C_{TOT}$ holds in the embodiment 5 and the 2nd term of Eq. (3) is decreased to the value small enough to remove the problem of $V_{TH}$ variation.

Embodiment 6

FIG. 6 is a cross-sectional view explaining the sixth embodiment. 601 is, e.g., a P-type Si substrate, 602 is a field oxide film, and 603 is a floating gate. 604 denotes four input gates. The feature of this embodiment is that another control gate 605 is formed under the floating gate through an insulating film 606. Here, $C_c$ denotes a capacitive coupling coefficient between the floating gate and control gate 605 and $C_{TOT}$ is assumed to be large enough as compared to $C_\theta$; i.e., $C_\theta/C_{TOT} \approx 0$ ($C_{TOT} \approx C_1+C_2+C_3+C_4$ and $C_1$–$C_4$ are capacitive coupling coefficients between the floating gate and each of four input gates). Then, Eq. (3) reduces to $$V_{TH}{=}V_{TH}{-}(C_c/C_{TOT})V_c. \quad (8)$$

Here, $V_o$ is potential of the control gate and $Q_F$ is assumed to be O. Eq. (8) indicates that $V_{TH}$ can be controlled by $V_c$. In other words, if the circuit shown in FIG. 1(*d*) is constructed using νMOS shown in FIG. 6, the threshold $V_{TH}$, with which $V_{OUT2}$ changes from OV to $V_{DD}$ to input can be changed by the input voltage applied to the control gate, indicating that the threshold of neuron operation can be changed and a neuron computer can be designed more flexibly.

Such a variable threshold function is not restricted to the structure of FIG. 6. In each case of FIGS. 1, 2, 4 and 5, the same function is realized by utilizing one of input gates as a control gate.

For the case $Q_F \neq 0$ in Eq. (3), Eq. (8) is revised as $$V_{TH}{=}V_{TH}{-}(C_c/C_{TOT})V_c{-}Q_F/C_{TOT}. \quad (9)$$

Under the condition $V_c{=}0$, this device operates with $$V_{TH}{=}V_{TH}{-}Q_F/C_{TOT}. \quad (10)$$

First, if the device is assumed to be under the condition $Q_F{=}0$, $V_{TH}{=}V_{TH}$. Then, a voltage of +20 V is applied to every input gate 604 under the condition of $V_c{=}0$ ($V_1{=}V_2{=}V_3{=}V_4{=}20V$). If the device is designed so that $(C_1+C_2+C_3+C_4):C_c{=}4:1$, then $V_F{=}16$ V. The thickness of the gate oxide film 607 in the channel region is, e.g., 100 Å. The voltage of 16 V applied to the gate oxide film causes electron to flow through the oxide film to the floating gate; the electron injection to the floating gate occurs, resulting in $Q_F{<}0$. From Eq. (10), $V_{TH}$ is expressed as follows:

$$V_{TH}{=}V_{TH}{+}|Q_F|/C_{TOT}$$

indicating that $V_{TH}$ becomes larger by $|Q_F|/C_{TOT}$ than that before electron injection. The $V_{TH}$ variation can be controlled by controlling the voltage applied to each input gate; $V_{TH}$ can be changed from 20 V for the case of $V_1{=}V_2{=}V_3{=}V_4$. It is also possible that each input gate has different voltage. On the other hand, in the case where $V_1{=}V_2{=}V_3{=}V_4{=}-20$ V, the electron is discharged from the floating gate, resulting in $Q_F{<}0$. In this case, $$V_{TH}{=}V_{TH}{-}Q_F/C_{TOT}$$

Namely, the threshold becomes small as compared with that before injection. The electron discharge is also carried out under the condition that $V_1{=}V_2{=}V_3{=}V_4{=}0$ V and $V_c{=}-20$ V.

As mentioned above, the electron injection or discharge through a insulating film which is carried out by controlling the potential of floating gate 603. As a result, the amount of charge in the floating gate can be controlled. Namely, the threshold of the neuron element can be changed according to Eq. (10). When $V_{TH'}$ is controlled by this method, its value is maintained unchanged until the next injection or discharge is carried out. That is, the value of $V_{TH'}$ is memorized even if a power supply of the circuit is cut off. In the explanation of FIG. 6, the electron injection or discharge through a gate oxide film is described, but this can also be made at other portions; for example, an oxide film 606 between the floating gate and the control gate 605 or an oxide film 608 between the floating gate and input gate 604. It is also possible to make injection or discharge through a portion of oxide film 606, 607, 608 which is formed to be thin. In FIG. 6, different voltages are applied to the control gate 605 and the input gate 604 to control the injection or discharge. The injection or discharge is also made by applying different voltages to each of input gates. Namely, it is needless to particularly prepare control gate such as 605. For example, in the examples in FIGS. 1, 2, 4 and 5, the same operation can apparently be made by controlling the voltage applied to each input gate. But in any case the injection and discharge must be prevented from occurring during ordinary switching operation. Thus, higher voltage must be required for the injection or discharge operation than for switching operation.

A neuron element using √MOS of this invention is realized in configurations such as that shown in FIG. 1(d), where the resistor 122 is used as a load element connected to √MOS 124. Other elements can be used instead of a resistor. The examples are shown in FIGS. 7(a) and 7(b).

Figure 7A:
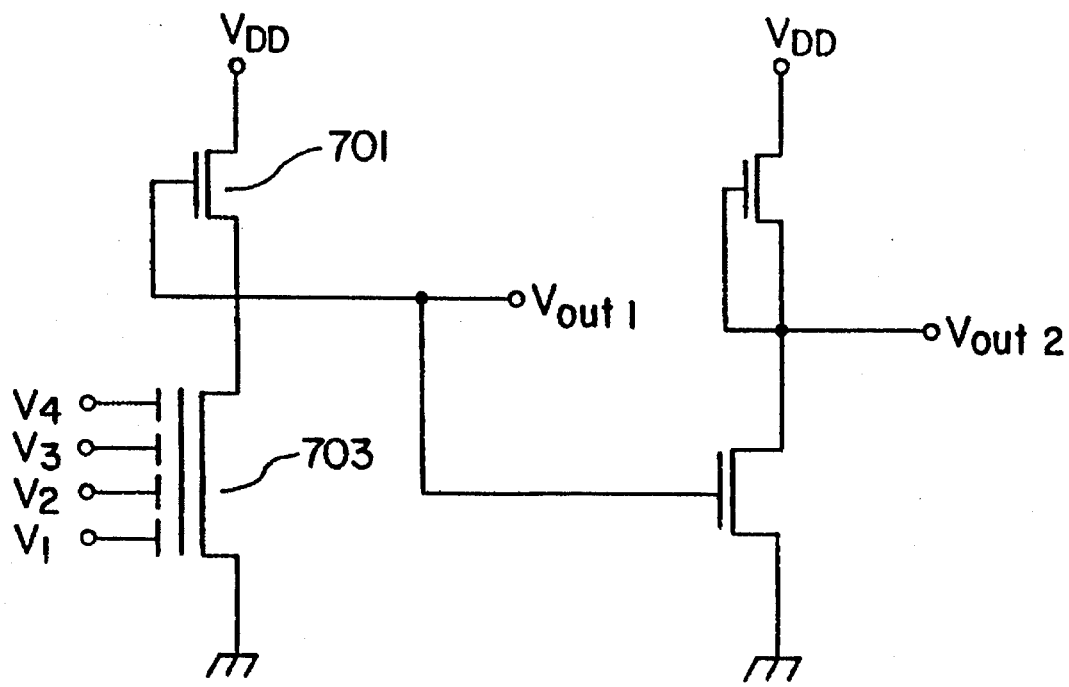
FIG. 7 is a diagram of a circuit illustrating another example.
Figure 7B:
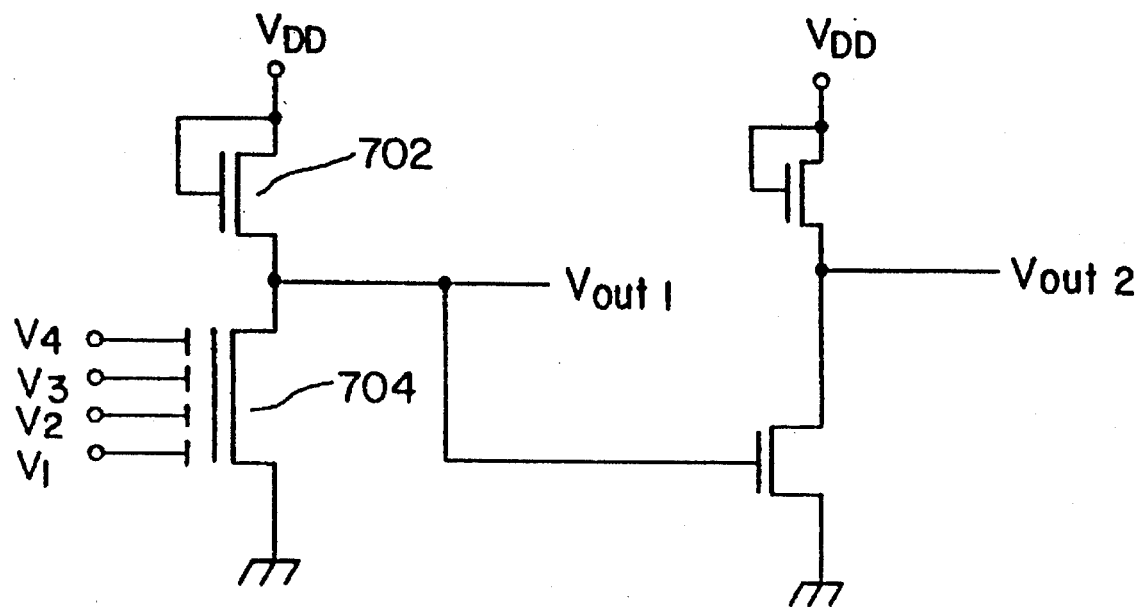

In FIGS. 7(a) and 7(b), N-channel depletion mode MOS transistor 701 and N-channel enhancement mode transistor 702 are used as a load element, respectively. An N-channel √MOS is formed on a P-type substrate in FIGS. 1, 2, 4, 5, 6 or 7. The same function can also be realized for the case where a p-channel √MOS is formed on a N-type substrate.

Embodiment 7

Figure 8A:
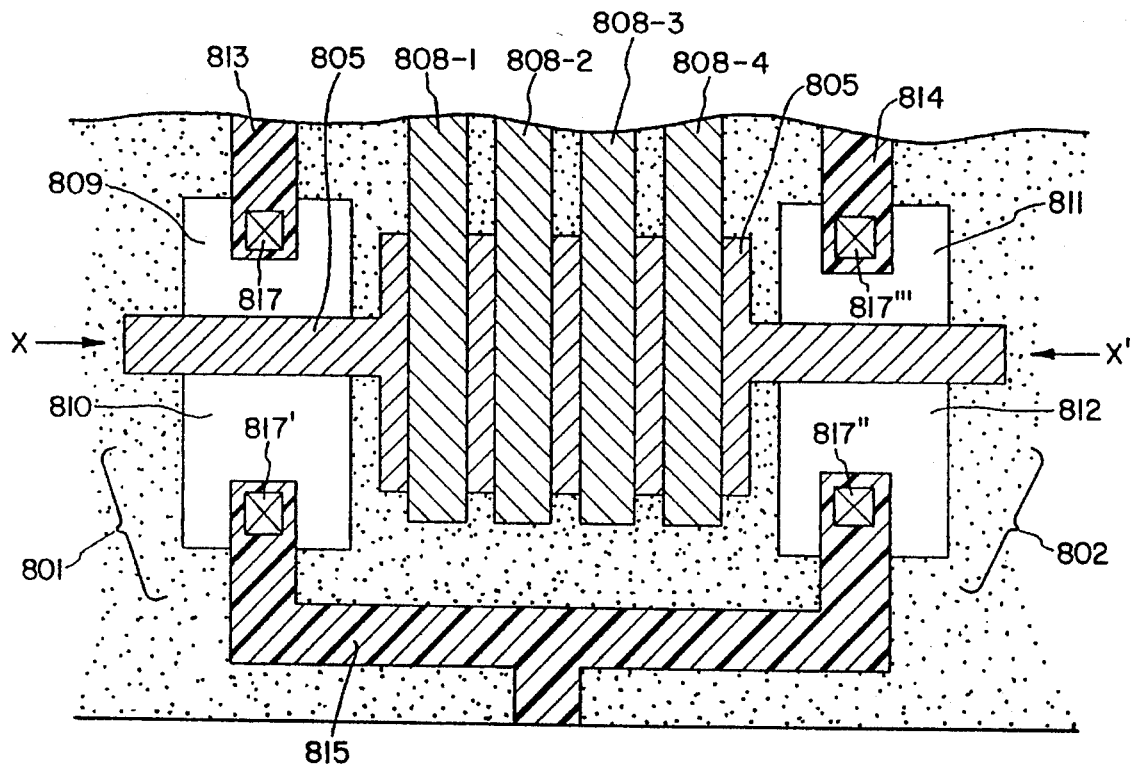
FIG. 8(a) is a plan view of device.
Figure 8B:
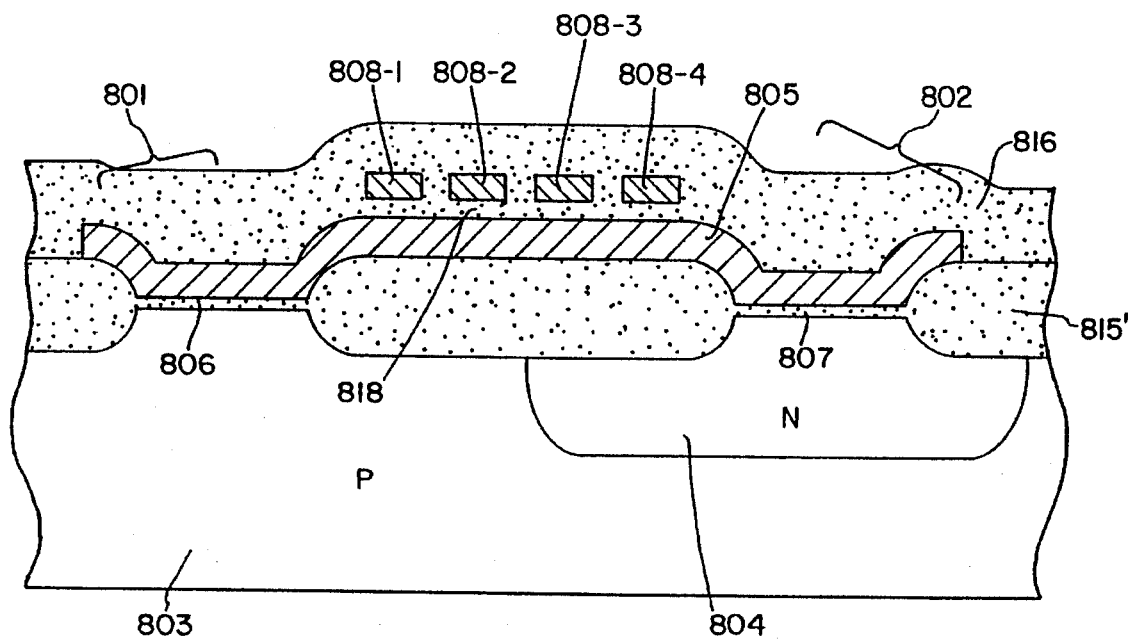
FIG. 8(b) is a cross-sectional view along X-X' line of FIG. 8(a) and FIG. 8(c) is a graph showing characteristics.

As a method for constructing a neuron element using √MOS of this invention, the configuration such as those in FIGS. 1(d), 7(a) and 7(b) have been described so far. These configurations have such a problem that direct current flows from $V_{DD}$ to the ground when MOS 124, 703, 703 is under conductive condition. Particularly in the case where MOS is connected to an NMOS inverter as shown in the figure, stand-by current always flows through either one of two paths when $V_{out2}$ is at HIGH and LOW levels. This is undesirable from a viewpoint of power dissipation. The output of $V_{out1}$ is at low level when $Z>V_{TH'}$. However, it is not exactly 0, but $V_{DDX}R_{ON}/(R_{ON}+R_L)$. Here, $R_{ON}$ is on-resistance of √MOS and $R_L$ is a resistance of load element. Since the value of $R_{ON}$ and $R_L$ are usually designed so that $R_{ON} \ll R_L$, the output voltage becomes nearly zero. But the output of exactly 0 V is preferable. The embodiment 7 is demonstrated as an example to meet these requirements. FIG. 8(a) is a plan view explaining the embodiment 7 and FIG. 8(b) is a cross-sectional view along X-X' line of FIG. 8(a).

801 is an n-channel √MOS formed on a p-type substrate 803, 802 is a p-channel √MOS formed on a n-type substrate 804. 805 is a floating gate formed over the p-type substrate 803 and the n-type substrate 804 through insulating films 806 and 807. 808-1, 808-2, 808-3 and 808-4 are input gates. 809 and 810 are $n^+$ source and $n^+$ drain, respectively. 811 and 812 are $p^+$ source and $p^+$ drain, respectively. 813, 814, and 815 are Al interconnects; 813 is connected to $V_{ss}$ (ground) potential and 814 to VDD (positive supply voltage, e.g., 5 V). 815' is a field oxide film and 816 is an insulating film under Al interconnects. 817, 817', 817'' and 817''' are contact holes formed in the insulating film 816. In NMOS and PMOS, a gate length, a gate width and thickness of a gate film are, for example, 1 μm, 3 μm and 200 Å, respectively. All overlapping regions between the floating gate and each input gate have the same area of 4.5 μm$^2$. The insulating film between them is made of 100 Å thick $SiO_2$. In this case, let Z denote the potential of floating gate, which is given by $$Z=0.214(V_1+V_2+V_3+V_4). \quad (11)$$

Figure 8C:
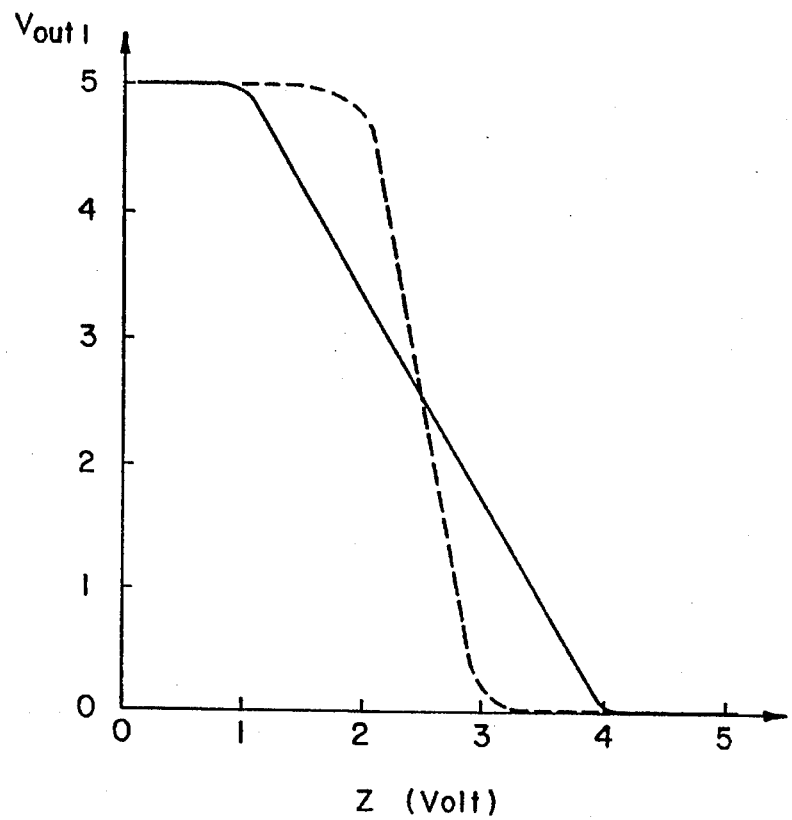

Here, $V_1$, $V_2$, $V_3$ or $V_4$ is input voltage applied to respective input gate. When a threshold voltage $V_{Tn'}$ of n-channel √MOS 801 and a threshold voltage $V_{Tp'}$ of p-channel √MOS 802 as seen from the floating gate are set to be 1 V and −1 V, respectively, the potential $V_{out1}$ of 815 to Z is shown by the solid line of FIG. 8(c). When Z<1 V, n-channel √MOS 801 turns off and p-channel √MOS 802 turns on. Therefore, $V_{out1}$ becomes 5V. When Z>4 V, on the other hand, p-channel √MOS 802 turns off and n-channel √MOS 801 turns on and then $V_{out1}$ becomes 0 V. This means that the low level is exactly outputted and no stand-by current flows at the low level, indicating that a neuron element dissipating little power can be formed. The broken line in FIG. 8(c) shows the relationship between Z and $V_{out1}$ when $V_{Tn'}=2$ V and $V_{Tp'}=-2$ V. In this case, the characteristics steeply changes from 5 V to 0 V. This characteristics can be controlled by the selection of $V_{Tn'}$ and $V_{Tp'}$. The 7th embodiment of this invention is a √MOS having an excellent characteristics of low power dissipation. Both n-channel √MOS and p-channel √MOS share the same floating gate and complementarily control the on and off each other, so this √MOS is called complementary √MOS or C-√MOS in short.

So far only the case where √MOS is formed on the bulk Si wafer has been described, but the device of this invention can also be formed on, for example, SOI substrate, i.e., silicon layer on an insulating film.

Embodiment 8

Figure 9:
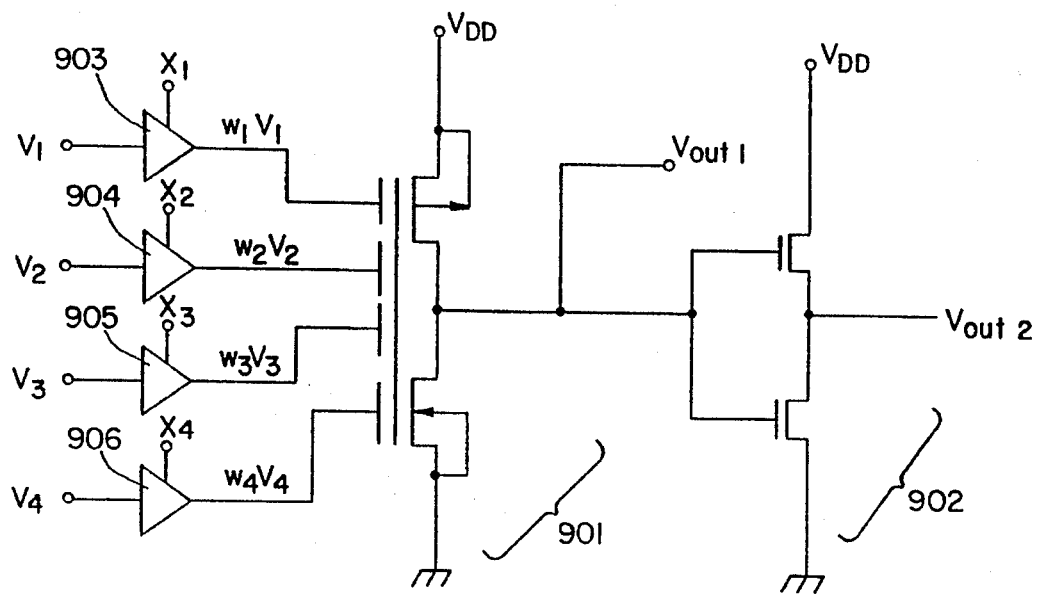
FIG. 9 is a diagram of circuit explaining embodiment 8.

FIG. 9 shows the 8th embodiment of the invention and an example of the configuration of neuron element using C-√MOS. 901 is a symbol of 4-input-gate C-MOS and 902 is a CMOS inverter. 903, 904, 905 and 906 are the circuits which multiply input voltage $V_1$, $V_2$, $V_3$ and $V_4$ by respective weight coefficients $W_1$, $W_2$, $W_3$ and $W_4$ determined by the control voltages $X_1$, $X_2$, $X_3$ and $X_4$ and then output weighted voltages to the input gates of C-√MOS. The output of $V_{out2}$ is LOW when $V_{out1}$ is HIGH and HIGH when $V_{out1}$ is LOW. In both cases of $V_{out2}$ being at HIGH and LOW levels, no stand-by current flows in C-√MOS 901 or CMOS inverter 902. Although 801-1 to 801-4 are all used as input gates in the examples of FIGS. 8 and 9, at least one of these can be used as a control gate like 605 as described in FIG. 6. $V_{Tn}$ and $V_{Tp}$ are controlled, for example, by applying a fixed voltage to 801-1. The control gate such as 605 can be prepared separately. It is needless to say that the injection of charge to the floating gate is also utilized.

Figure 10:
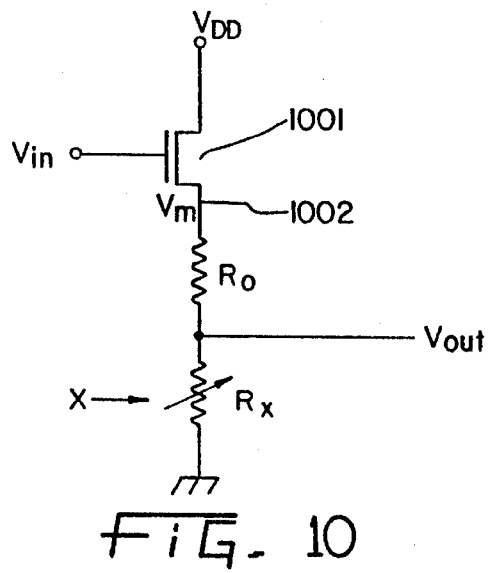
FIGS. 10 and 11 are diagrams of a circuit illustrating other examples.

Next, the weight-product circuit demonstrated in FIGS. 3 and 9 (302-1 to 302-n, 903, 904, 905 and 906) is described below. FIG. 10 is a circuit demonstrating an example of weight-product circuit. For example, 1001 is NMOS having a threshold $V_{TH}$ of about 0 V. $R_θ$ denotes a resistor and $R_x$ a variable resistor controlled by input voltage X. Let $V_m$ denote the potential at 1001, which is given by $V_m = V_{in} - V_{TH}$. If $V_{TH} = 0$, then $V_m = V_{in}$. Therefore, the output voltage $V_{out}$ is given by $$V_{out} = V_{in} \cdot R_x/(R_\theta + R_x). \tag{12}$$

Figure 11:
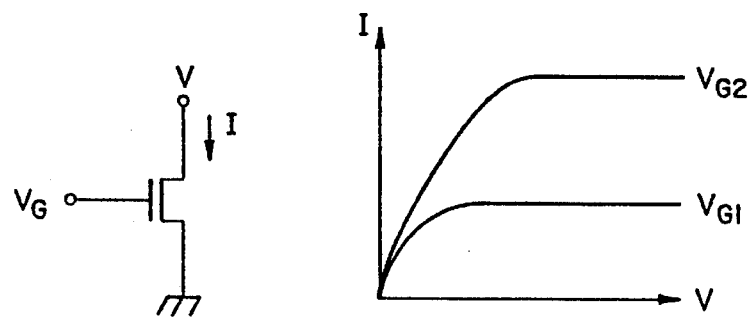

Namely, this circuit has such a function that input $V_{in}$ is multiplied by weight coefficient of $R_x/(R_\theta + R_x)$ and then outputted. Therefore, if the value $R_x$ of a variable resistor is controlled by input voltage X, the weight coefficient can arbitrarily be changed. Such a variable resistor can be realized using one MOSFET as shown in FIG. 11. When a constant voltage $V_\theta$ is applied to the gate, the current-voltage characteristics becomes as shown in the figure, indicating that MOSFET is used for a variable resistor. However, as is apparent from the figure, much attention must be paid to the design of the circuit because of strong nonlinearity.

Embodiment 9

Figure 12:
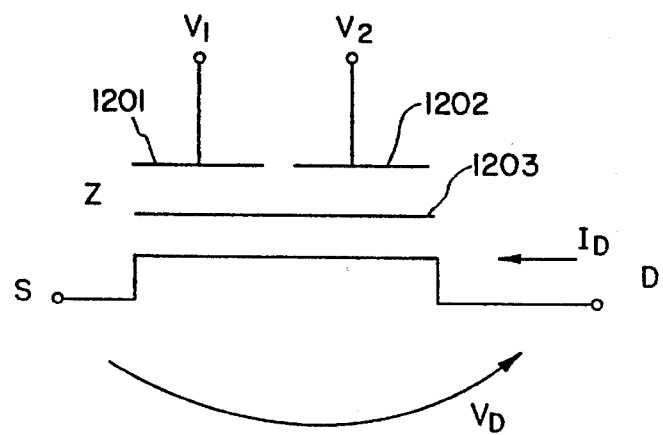
FIG. 12 is a schematic diagram of a circuit explaining embodiment 9.

It will be described below that a variable resistor with excellent linearity is realized by using √MOS of this invention. First, the characteristic of √MOS is generally analyzed. FIG. 12 shows a symbol of √MOS with two input gates 1201, 1202 where $V_d$ denote the drain potential when a source is grounded. $V_1$ and $V_2$ the input gate potential and Z the potential of the floating gate 1203. Here, L and W denote a channel length and a channel width of √MOS, respectively and $V_{th}$ denote the threshold voltage as seen from the floating gate. Then the drain current $I_d$ is expressed by the following equation:

$$I_D = (W/L)\mu_n C_\theta [(Z - V_{TH})V_D - (1/2)V_D^2] \tag{12'}$$

Here, $\mu_n$ is surface electron mobility and $C_\theta$ is a capacitance of a gate oxide film under the floating gate. Z is given by $$Z = W_1 V_1 + W_2 V_2 \tag{13}$$

where $$W_1 = C_1/(C_\theta + C_1 + C_2)$$

$$W_2 = C_2/(C_\theta + C_1 + C_2)$$

Figure 13A:
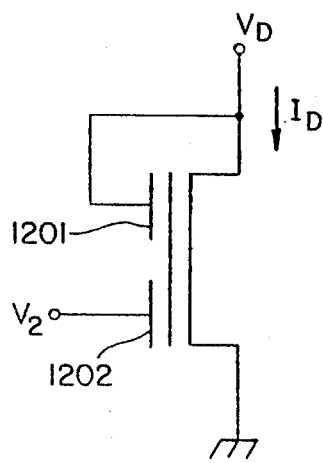
FIG. 13(a) is a diagram of a circuit and FIG. 13(b) is a graph showing characteristics.

The 9th embodiment of this invention is shown in FIG. 13. The first input gate 1201 of √MOS is connected to a drain and a constant voltage is applied to the second input gate 1202. If $V_1 = V_D$ is substituted into Eq. (13) and then Eq. (12'), $I_D$ is obtained as $$\begin{aligned} I_D &= (W/L)\mu_n C_\theta [(W_1 V_D + W_2 V_2 - V_{TH})V_D - (1/2)V_D^2] \\ &= (W/L)\mu_n C_\theta [(W_1 - 1/2)V_D^2 + (W_2 V_2 - V_{TH})V_D] \end{aligned}$$

Here if we take $W_1 = 1/2$ the term of $V_D^2$ disappears and the following equation is obtained:

$$I_D = (W/L)\mu_n C_\theta [(W_2 V_2 - V_{TH})V_D] \tag{14}$$

Figure 13B:
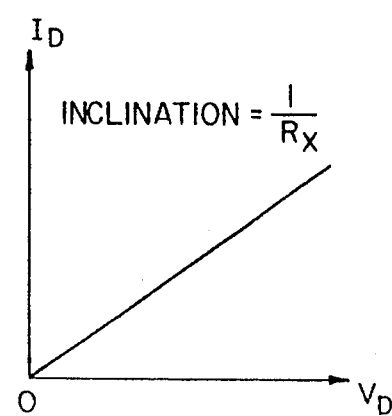

As is shown in FIG. 13(b), $I_D$ is proportional to $V_D$, indicating that √MOS acts as a linear resistance element. The resistance $R_x$ for direct current as seen from the outside is given by $$(1/R_x) = (W/L)\mu_n C_{74} (W_2 V_2 - V_{TH}) \tag{15}$$

In other words, the value of resistance can be controlled by the value of $V_2$. For $R_x > 0$ in Eq. (15)

$$W_2 V_2 - V_{TH} > 0 \tag{16}$$

Therefore, $W_2$ and $V_{TH}$ must be determined so that Eq. (16) holds. If the depletion mode √MOS is employed, $V_{TH} < 0$; that is, Eq. (16) always holds. For $W_1 = 1/2$, $$C_1/(C_\theta + C_1 + C_2)$$

i.e.

$$C_\theta + C_2 = C_1$$

For this reason, it is desirable to employ the structure which is shown in FIG. 5 as the embodiment 5 of the invention and can lessen the affect of $C_\theta$. By using the circuit of FIG. 13(a) for $R_x$ of FIG. 10, the resistance value can be controlled by the value of $V_2$ and thus ideal weight-product circuit can be realized. As has been mentioned, √MOS can effectively be applied to various circuits.

So far the charge in the floating gate has been assumed to be zero. For the case of charge $Q_F$ being not zero, the resistance in Eq. (15) is revised to $$(1/R_x) = (W/L)\mu_n C_\theta (W_2 V_2 - V_{TH} + Q_F/C_{TOT}). \tag{15'}$$

As described in the embodiment 6, the value of resistance can be memorized by making use of the phenomenon of electron injection to the floating gate or electron discharge from the floating gate. The voltage is applied to $V_2$ only when electron injection is made. $V_2$ is kept constant during ordinary operation.

Embodiment 10

All neuron circuits which has been described so far are constructed using single positive supply voltage. Therefore all signals have only positive value and negative signal cannot be handled.

Figure 14A:
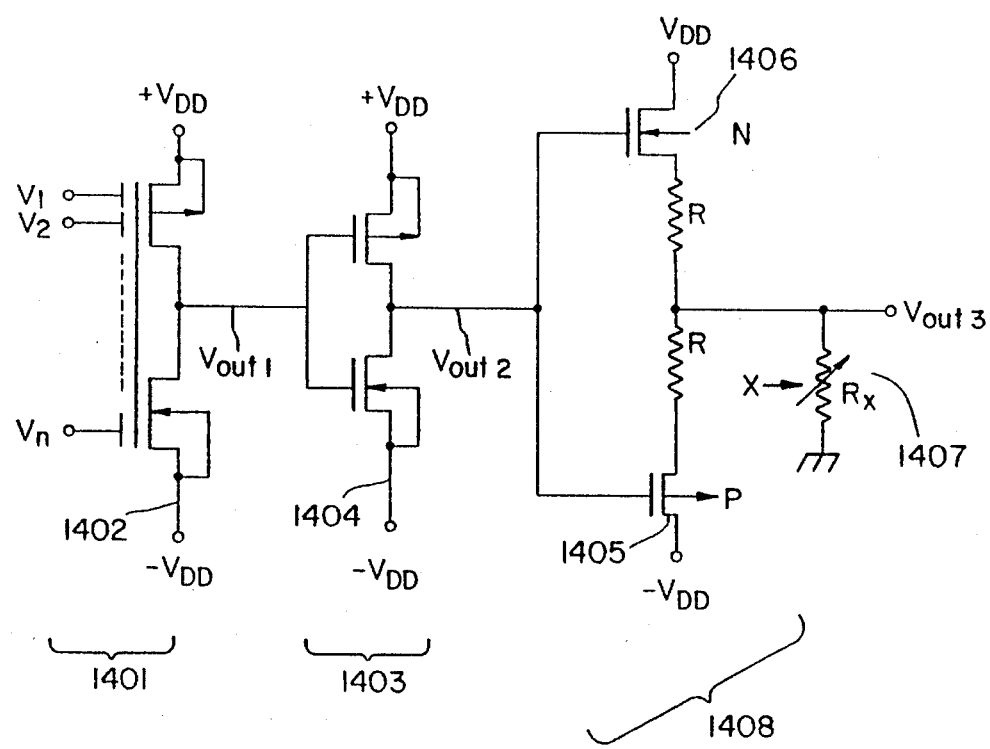
FIG. 14 is a schematic diagram of circuit explaining embodiment 10.
Figure 14B:
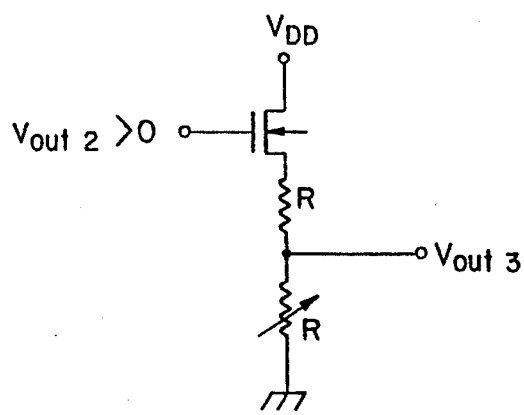

FIG. 14 is a circuit of the embodiment 10 which can deal with both positive and negative signals. 1401 is a C-√MOS such an that described in FIG. 8. The source 1402 of N-channel √MOS is connected to a negative supply voltage ($-V_{DD}$). 1403 is a CMOS inverter. The source 1404 of NMOS is also connected to ($-V_{DD}$). 1405 and 1406 are, respectively, P-channel MOS and N-channel MOS, the thresholds of which are set nearly 0 V. $V_1 \ldots V_n$ are inputs with positive or negative value. $V_{OUT2} = +V_{DD}$ if $Z > V_{TH}$, and $-V_{DD}$ if $Z < V_{TH}$. Then, the operation of the circuit 1408 is discussed. When $V_{OUT2}$ is positive, PMOS 1405 turns off and 1408 is expressed by FIG. 14(b). Then, $V_{OUT3}$ is given by $$V_{OUT3} = (R_x/(R + R_x))V_{OUT2}. \tag{17}$$

Figure 14C:
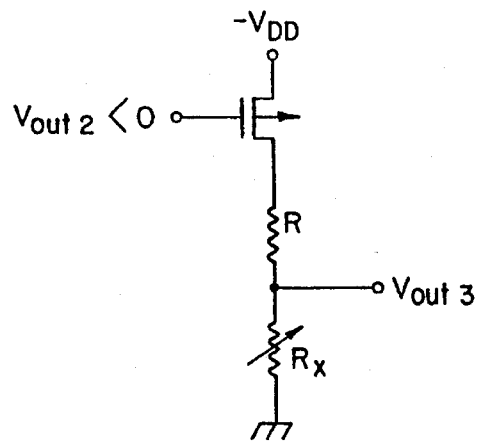

The $V_{OUT3}$ outputs positive values. In the case of $V_{OUT2}$ being negative, on the other hand, NMOS turns off and 1408 is shown by FIG. 14(c). Namely, $$V_{OUT3} = (R_x/(R + R_x))V_{OUT2}. \tag{18}$$

Therefore, the negative value is outputted, suggesting that multiplication of weight coefficients which takes the sign into account can be made. Making use of a circuit such as 1408 for 903 to 906 in FIG. 8(c), a neuron circuit can be constructed which is capable of dealing with both positive and negative signals. As a variable resistor of this circuit, √MOS circuit shown in the embodiment 9 can be used.

Embodiment 11

Figure 15:
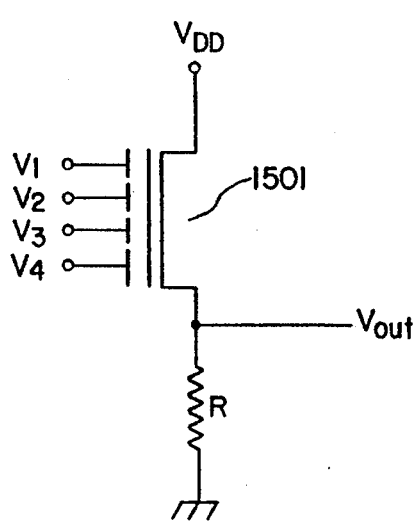
FIG. 15 is a schematic diagram of circuit explaining embodiment 11.

√MOS is applied to various elements for neural computer as mentioned above and also has wide application in other fields. FIG. 15 is a circuit of the embodiment 11. 1501 is a four-input-gate √MOS and the input voltages $V_1$, $V_2$, $V_3$, $V_4$ are applied to respective input gates. Let Z denote the floating gate potential, which is given by: $Z=W_1V_1+W_2V_2+W_3V_3+W_4V_4$. Then, $$V_{out}=Z-V_{TH}$$

Here, $V_{TH}$ is the threshold of MOS as seen from the floating gate. In the case of $V_{TH}$ being nearly 0 V, $V_{out}$ is expressed as $$V_{out}=W_1V_1+W_2V_2+W_3V_3+W_4V_4$$

This is a circuit to output a linear sum of weighted input voltage. Such function is very useful for. e.g., multi-valued logic circuit. The circuit with this function dissipates very little power as compared with the circuit which performs sum operation of voltage by making use of current additivity. Also the remarkable improvement of integration density is achieved because the circuit is realized with a single element.

Embodiment 12

Figure 16:
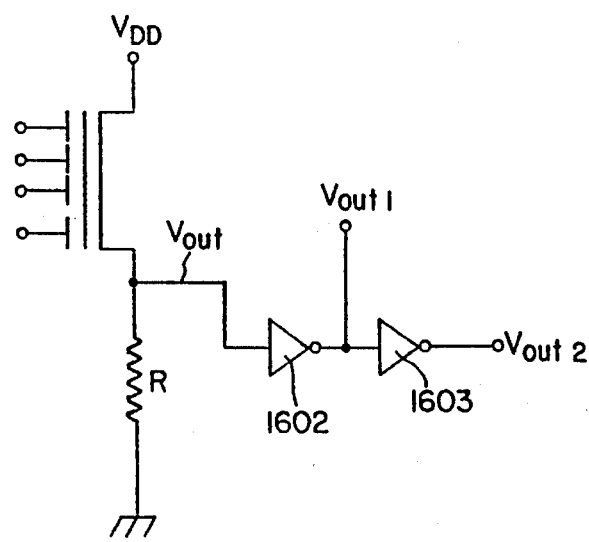
FIG. 16 is a schematic diagram of circuit explaining embodiment 12.

FIG. 16 shows the 12th embodiment which is an example of neuron circuits using the circuit shown in FIG. 15. $V_{out}$ is connected to 2-stage inverters 1602, 1603 and $V_{out2}$ is outputted. The threshold of the inverter 1602 is defined as $V_{TH}$. When $W_1V_1+W_2V_2+W_3V_3+W_4V_4>V_{TH}$, the output of $V_{out}$ becomes HIGH. Namely, this circuit apparently performs a neuron function. As inverters 1602, 1603, E-R type, E—E type or E-D type of NMOS or CMOS type inverter can be used.

Embodiment 13

Figure 17:
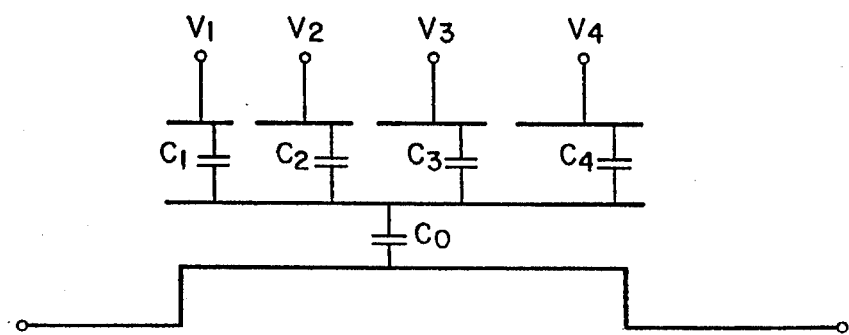
FIG. 17 is a schematic diagram of circuit explaining embodiment 13.

FIG. 17 is a structure of √MOS illustrating the 13th embodiment. Capacitive coupling coefficients between a floating gate and four input gates are indicated by $C_1$, $C_2$, $C_3$ and $C_4$ and are designed so that $C_2=2C_1$, $C_3=4C_1$ and $C_4=8C_1$. The floating gate potential Z is given by $$\begin{aligned}Z &= (C_1/C_{TOT})V_1 + (C_2/C_{TOT})V_2 + (C_3/C_{TOT})V_3 + \\ &\quad (C_4/C_{TOT})V_4 \\ &= (C_1/C_{TOT})(V_1 + 2V_2 + 4V_3 + 8V_4).\end{aligned} \quad (19)$$

Here, if the values of $V_1$, $V_2$, $V_3$ and $V_4$ are either of 1 or 0, the number of $(V_1+2V_2+4V_3\,8V_4)$ in Eq. (19) corresponds to decimalized number of binary number $(V_4, V_3, V_2, V_1)$. In other words, Z indicates the voltage proportional to the decimal number into which binary number is transformed. Therefore, when √MOS of FIG. 17 is used for √MOS in FIG. 15, $V_{out}$ outputs the voltages which are obtained by D-A conversion of binary numbers $(V_4, V_3, V_2, V_1)$.

As described above, D-A conversion can be carried out using a single √MOS. This is an important application of √MOS.

Embodiment 14

Figure 18:
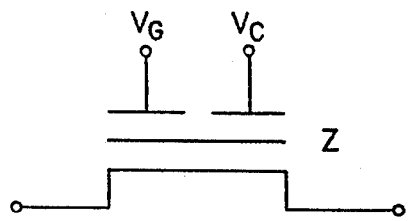
FIG. 18 is a schematic diagram of circuit explaining embodiment 14.

FIG. 18 is the 14th embodiment of this invention illustrating √MOS having two input gates $V_G$ and $V_C$. Here, Z denotes the floating gate potential, and $V_{TH}$ denotes the threshold as seen from the floating gate. Then, Z is given by $$Z=W_1V_G+W_2V_C.$$

The transistor turns on when $Z>V_{TH}$, i.e., $$W_1V_G+W_2V_C>V_{TH}.$$

When $$V_G>(1/W_1)(V_{TH}-W_2V_C) \quad (20)$$

this √MOS turns on. By assuming VMOS to be a single MOSFET having a gate $V_G$, this √MOS can be regarded as a transistor having a new threshold value $V_{TH'}$. Here, $$V_{TH'}=(1/W_1)(V_{TH}-W_2V_C). \quad (21)$$

As is apparent from Eq. (21), the threshold can be changed by applied voltage $V_C$. Such a transistor whose threshold value can be changed by the external signal has not existed up to now. This transistor is a very important circuit element to construct a multi-valued logic integrated circuit. This √MOS can easily realize the circuit without various ideas and considerations which have been proposed up to now.

Figure 23:
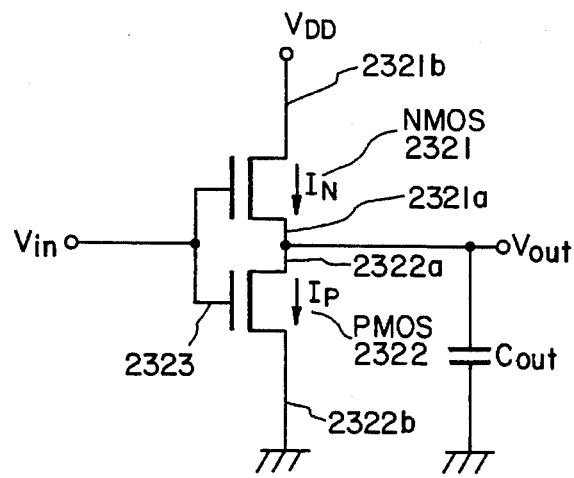
FIG. 23 is a conceptual diagram showing the circuit of Embodiment 15.

Embodiment 15 of the present invention is depicted in FIG. 23. In the diagram, an NMOS transistor 2321 (abbreviated as "NMOS"), a PMOS transistor 2322 (abbreviated as "PMOS"), sources 2321a and 2322a, drains 2321b and 2322b, and gate 2323 are depicted.

In general, in MOS type transistors, the electrode from which the carrier flows is termed "the source", while the electrode into which the carrier flows is termed "the drain". Accordingly, in the NMOS, the low potential side from which electrons flow is the source, while the high potential side is termed the drain. Furthermore, in the PMOS, the high potential side from which the hole flows out is the source, while the low potential side is the drain. Furthermore, the threshold voltages of the NMOS and PMOS have the values of $V_{TN}$ and $V_{TP}$, respectively, and in the present example, conditions are set such that $$V_{TN}<V_{TP} \quad (22)$$

If the current flowing through NMOS 2321 and PMOS 2322 is termed $I_N$ and $I_p$, respectively, and both transistors are operated in a saturation region, $$I_N=(\tfrac{1}{2})\cdot\beta_N(V_{GS}-V_{TN})^2 \quad (23),$$

and $$I_p=(\tfrac{1}{2})\cdot\beta_p(V_{GS}-V_{TP})^2 \quad (24).$$

Herein $$\beta_N=(W/L)_N\mu_NC_{OX}$$

$$\beta_P=(W/L)_P\mu_PC_{OX}$$

$(W/L)_N$: ratio of the channel width W and the channel length L of the NMOS.

$(W/L)_P$: ratio of the channel width W and the channel length L of the PMOS.

$\mu_N$: channel mobility of the electron $\mu_P$: channel mobility of the hole.

Figure 24:
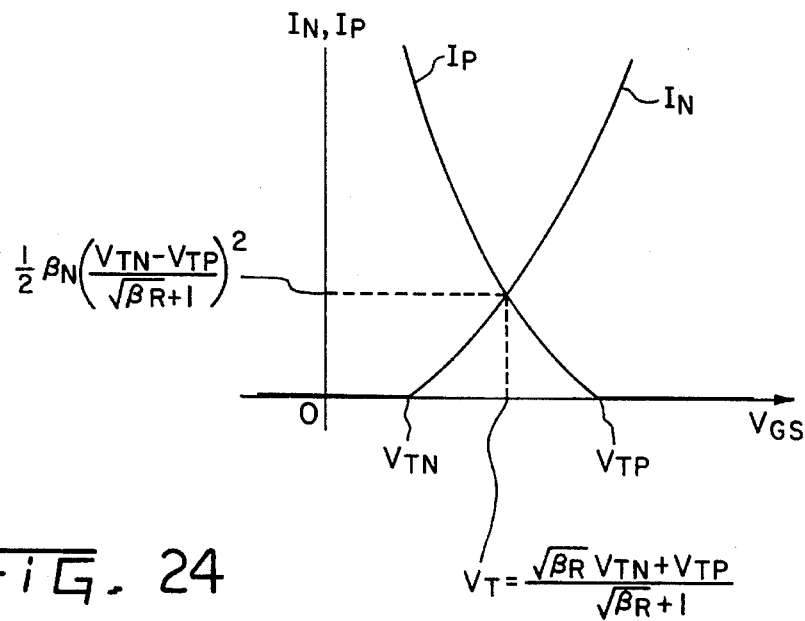
FIG. 24 is a graph showing the relationship between current flowing through the circuit of Embodiment 15 and $V_{GS}$.

FIG. 24 illustrates the relationship between $I_N$ and $I_p$, and $V_{GS}$; when a fixed voltage is inputted into $V_{in}$, the circuit is stable under conditions such that $I_N=I_p$. That is to say, at this time, $$V_{GS}=V_{in}-V_{out}=V_{TH}.$$

From the diagram, $V_T$ is given by the following formula:

$$V_T = \frac{\sqrt{\beta_R} \, V_{TN} + V_{TP}}{\sqrt{\beta_R} + 1} \quad (25)$$

The condition $V_{TN} < V_{TP}$ of formula (22) is a necessary and sufficient condition so that the $I_N$ and $I_p$ curves of FIG. 24 will have a crossing point.

Accordingly, $V_{out}$ is such that $$V_{out} = V_{in} - V_{TH} \quad (26).$$

This corresponds to the (1') of the conventional example. That is to say, an amplifier having a voltage gain of 1 is realized.

Now, $V_{in}$ is assumed to have changed to a low potential. That is to say, if $$V_{out} > V_{in} - V_T,$$

then $$V_{GS} = V_{in} - V_{out} < V_T.$$

At this time, as is clear from FIG. 24, a larger current flows in the PMOS, and the current flowing in the NMOS is reduced. In particular, when $V_{GS} < V_{TN}$, the NMOS is cut off, so that absolutely no current flows therein. In this manner, the charge stored in $C_{out}$ is discharged rapidly by the PMOS, $V_{out}$ follows the changes of $V_{in}$, and the circuit settles again when $$V_{out} = V_{in} - V_T.$$

On the other hand, when $V_{in}$ changes to the high potential side, and $V_{out} < V_{in} - V_{TH}$, then $V_{GS} = V_{in} - V_{out} > V_{TH}$, and this time, the PMOS changes to the OFF state, a large current flows in the NMOS, and $C_{out}$ is rapidly charged, so that $V_{out}$ is increased, and the circuit settles at the point at which $V_{out} = V_{in} - V_{TH}$.

In the above manner, the charging and discharging of $C_{out}$ is conducted by means of the ON state of the NMOS transistor and the PMOS transistor, respectively, so that high speed charging and discharging is possible, and it is possible to respond to an input signal which changes at high speed. In particular, if $\beta_N$ is set equal to $\beta_p$, the current driving ability of the NMOS and the PMOS becomes equal, the speed of charge and discharge becomes equal, and this is particularly advantageous for an increase in the circuit speed.

This is an important characteristic which is not found in conventional examples. In conventional examples, the charging period of $C_{out}$ is determined by $R_L \cdot C_{out}$, and insofar as $R_L$ is not reduced, it is impossible to reduce the charging time. However, if $R_L$ is reduced, the voltage gain is reduced, and the consumption of power increases in inverse proportion to $R_L$.

In the present invention, it is possible to shorten the charge and discharge time by any desired amount by means of increasing the $\beta_N$ and $\beta_p$ of the transistors. Moreover, even if the values of $\beta_N$ and $\beta_p$ are large, the voltage gain remains at a value of 1, and is not reduced. Moreover, as for the consumption of power, from FIG. 24, the current flowing in the steady state is $$I = (\frac{1}{2}) \cdot \beta_N \{(V_{TH} - V_{TP})/(\sqrt{\beta_R} + 1)\}^2 \quad (27)$$

so that it is possible to reduce the current I by as much as desired by setting the values of $V_{TN}$ and $V_{Tp}$ to nearly equal values, and it is thus possible to set the consumption power to a fixed small value or to essentially 0, irrespective of circuit operating speed.

As stated above, by means of the circuit of the present invention, it is possible to solve all problems which were present in conventional source follower circuits. Furthermore, the value of $V_T$ is in accordance with formula (25); the values of $V_{TN}$, $V_{TP}$, and $\beta_R$ can be appropriately set so as to set the value of $V_T$ to 0. For example, if $\beta_R = 1$, $V_{TN} = -1V$, and $V_{TP} = 1V$, then $V_{out} = V_{in}$, and it is possible to obtain a value at the output side which is equivalent to the input voltage. Furthermore, in order to set $V_T = 0$, it is of course possible to combine other values of $V_{TN}$, $V_{TP}$, and $\beta_R$.

Embodiment 16

In Embodiment 15, the threshold value $V_{TN}$ of the NMOS, and the threshold value $V_{TP}$ of the PMOS shown in FIG. 23 were such that $V_{TN} < V_{TP}$; however, it is also possible to set this so that $V_{TN} = V_{TP}$.

By doing this, it is possible to set the consumption power from formula (27) to 0.

Embodiment 17

In the circuit shown in FIG. 23, it is possible to set the threshold value $V_{TN}$ of the NMOS and the threshold value of $V_{TP}$ of the PMOS so that $$V_{TP} < V_{TN} \quad (28).$$

Figure 25:
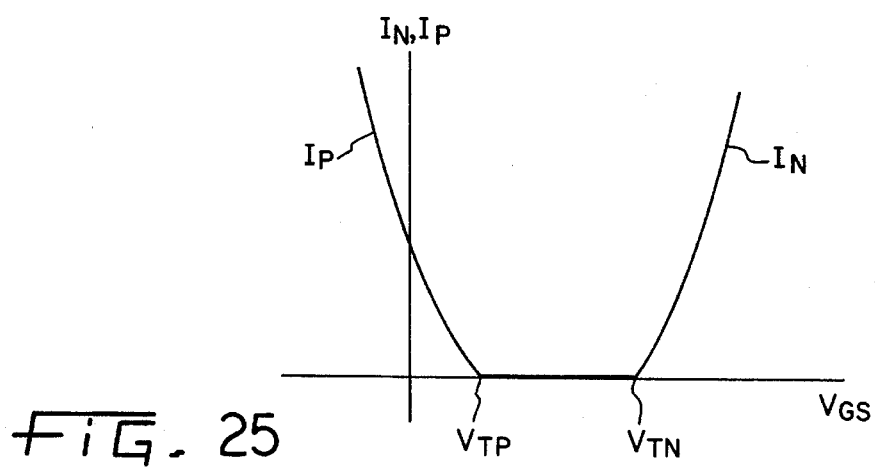
FIG. 25 is a graph showing the relationship between the current flowing through the circuit of Embodiment 17 and $V_{GS}$.

In this case, as shown in FIG. 25, the characteristics of $I_N$ and $I_p$ are such that they do not have a point of intersection, so that $V_{GS}$ may have a freely selected value within a range such that $$V_{TP} < V_{GS} < V_{TN}.$$

That is to say, $V_{out}$ will settle at some value within a range such that $$V_{in} - V_{TN} < V_{out} < V_{in} - V_{TP} \quad (29);$$

however, there is no guarantee that this will be a fixed value. That is to say, the value will be uncertain within the above range. From the point of view of circuit operation, it is permissible to adopt the conditions of formula (29), so long as the uncertainty of the value is permissible within the prescribed range. In such a case, the amount of current flowing in the steady state reaches 0, so that it is possible to realize a circuit having low consumption power.

Furthermore, if $V_{TP}$ is approximately equal to $V_{TN}$ while fulfilling the condition that $V_{TP} < V_{TN}$, it is possible to sufficiently minimize the uncertainty of the value of $V_{out}$ expressed in formula (29).

Embodiment 18

Embodiment 18 of the present invention is depicted in FIG. 4. In the present Embodiment, two circuits having a structure identical to that of Embodiment 15 (an A circuit and B circuit) are connected in parallel and form a circuit having a structure such that the inputs and outputs thereof are respectively connected.

Figure 26:
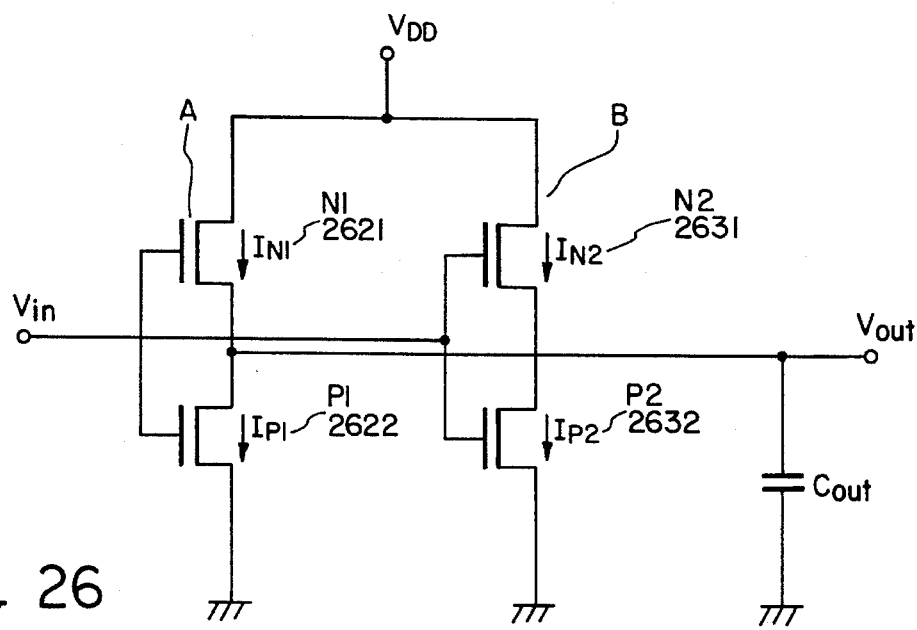
FIG. 26 is a conceptual diagram showing the circuit of Embodiment 18.

The parameters of each transistor of FIG. 26 are defined as given below.

|  | Threshold value | Channel length | Channel width |
|---|---|---|---|
| $N_1$ | $V_{TN1}$ | $L_{N1}$ | $W_{N1}$ |
| $P_1$ | $V_{TP1}$ | $L_{P1}$ | $W_{P1}$ |
| $N_2$ | $V_{TN2}$ | $L_{N2}$ | $W_{N2}$ |
| $P_2$ | $V_{TP2}$ | $L_{P2}$ | $W_{P2}$ |

In the present Embodiment, the threshold value is set in the following manner.

$$V_{TP2} < V_{TN1} < V_{TP1} < V_{TN2}$$

Furthermore, the W/L which indicates the current driving ability of the transistor, is such that $$W_{N1}/L_{N1} << W_{N2}/L_{N2}$$

$$W_{P1}/L_{P1} << W_{P2}/L_{P2}.$$

That is to say, the $N_2$ and $P_2$ transistors are set so as to possess a sufficiently large current driving ability in comparison with the $N_1$ and $P_1$ transistors.

In this circuit, component circuits A and B have inputs and outputs which are respectively connected, so that $$V_{GS1} = V_{GS2}.$$

Figure 27:
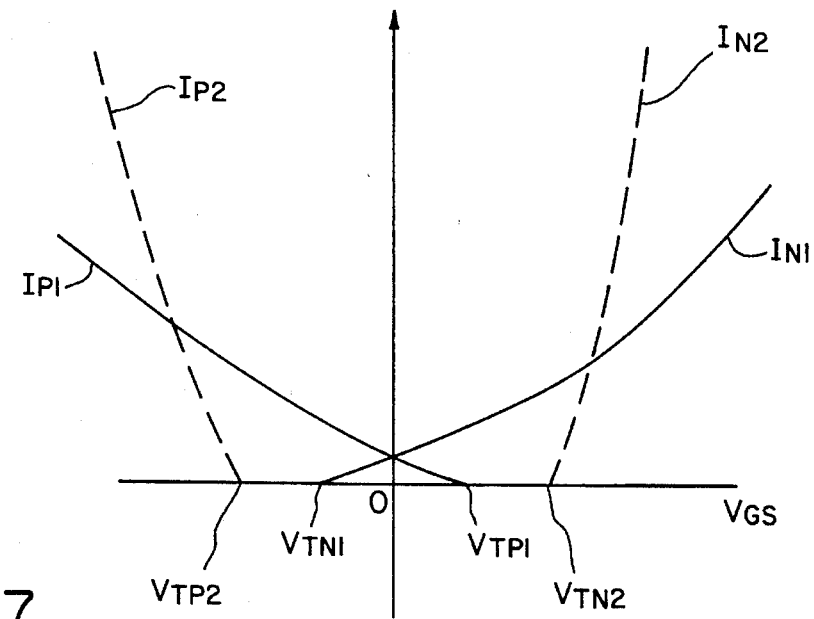
FIG. 27 is a graph showing the relationship between current flowing through the circuit of Embodiment 18 and $V_{GS}$.

If the function of $V_{GS}$ is used and the currents flowing in the respective transistors are expressed, the graph shown in FIG. 27 will result.

The respective component circuits are set so that $\beta_R = 1$. Furthermore, setting is conducted so that $V_{TP1} = |V_{TN1}|$, and from formula (25), $V_T = 0$; that is to say, $V_{out} = V_{in}$.

When this circuit maintains a fixed output voltage such that $V_{out} = V_{in}$ (that is to say, when $V_{GS} = 0$), no current flows in circuit B. The reason for this is that, as is clear from FIG. 27, when $V_{GS} = 0$, both transistors $N_2$ and $P_2$ are placed in an OFF state. On the other hand, transistors $N_1$ and $P_1$ are both in an ON state, so that from formula (27), $$I = (\tfrac{1}{2}) \cdot \beta_{N1} \{(V_{TN1} - V_{TP1})/2\}^2$$

Here if $|V_{TN1}| - V_{TP1}$ is designated, then $$I = (\tfrac{1}{2}) \cdot \beta_{N1} V_{TN1}^2 \quad (30)$$

results, and a current I flows in the circuit. Here $\beta_{N1}$ represents the $\beta$ of transistor $N_1$, and $$\mu_{N1} = \mu_N C_{OX} W_{N1}/L_{N1}.$$

From formula (30), by means of sufficiently reducing $\beta_{N1}$ and $V_{TN1}$, it is possible to reduce the steady state consumption current by any desired amount. Moreover, the $V_{TN1} < V_{TP1}$ relationship is maintained, so that the uncertainty present in the output voltage in accordance with formula (10) is not present.

Figure 28A:
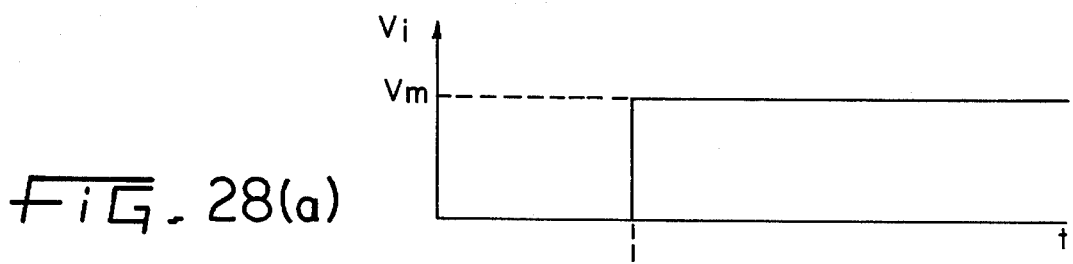
FIG. 28 is a graph showing the response characteristics of the output voltage in the circuit of Embodiment 18.
Figure 28B:
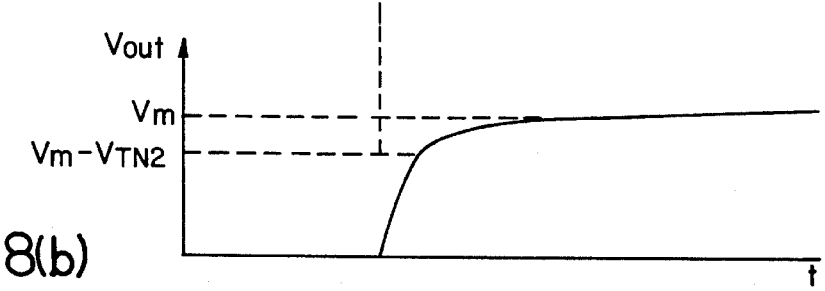
Figure 28C:
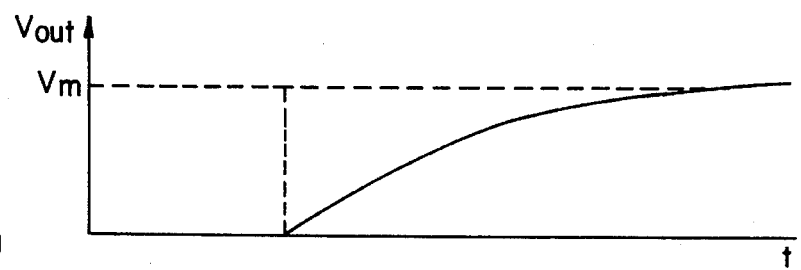

Now, if $V_{in}$ is altered, so that $V_{GS} = V_{in} - V_{out} > V_{TN2}$, transistor $N_2$ will be placed in an ON state simultaneously with transistor $N_1$. In comparison with transistor $N_1$, transistor $N_2$ is such that $W_{N1}/L_{N1} << W_{N2}/L_{N2}$, so that, as shown in FIG. 26, a sufficiently large current flows, and change is effected so that $V_{out} = V_{in} - V_{TN2}$ in an extremely short time. After this, only $N_1$ is placed in an ON state, so that change occurs slowly, so that $V_{out} = V_{in}$. The state of this change is shown in FIG. 28(b). FIG. 28(c) shows the following characteristics in the case of solely the component circuit A, and it can be seen that by means of the addition of circuit B, a further increase in circuit speed can be achieved.

When change occurs so that $V_{in}$ becomes smaller, in the same manner, when $V_{GS} = V_{in} - V_{out} < V_{TP2}$, $P_2$ is placed in an ON state and a large charging current flows, so that $V_{out}$ changes rapidly.

In the present Embodiment, $V_{out}$ follows the changes of $V_{in}$ promptly, so that an NMOS ($N_2$) and a PMOS ($P_2$) having a large current driving ability are prepared, and by means of these, charge and discharge are accomplished swiftly; however, a fixed level is maintained, so that the current which flows is determined by the transistors ($N_1$ and $P_1$) having a small current driving ability, so that it is possible to maintain a small steady state consumption power. Such a circuit is particularly advantageous in the case in which a large capacitance load is driven.

Embodiment 19

In Embodiment 18, the threshold values of each transistor shown in FIG. 26 were set so as to satisfy the conditions that $V_{TP2} < V_{TN1} < V_{TP1} < V_{TN2}$; however, it is also possible to set these values such that $$V_{TN1} < V_{TP2} < V_{TN2} < V_{TP1}.$$

Figure 29:
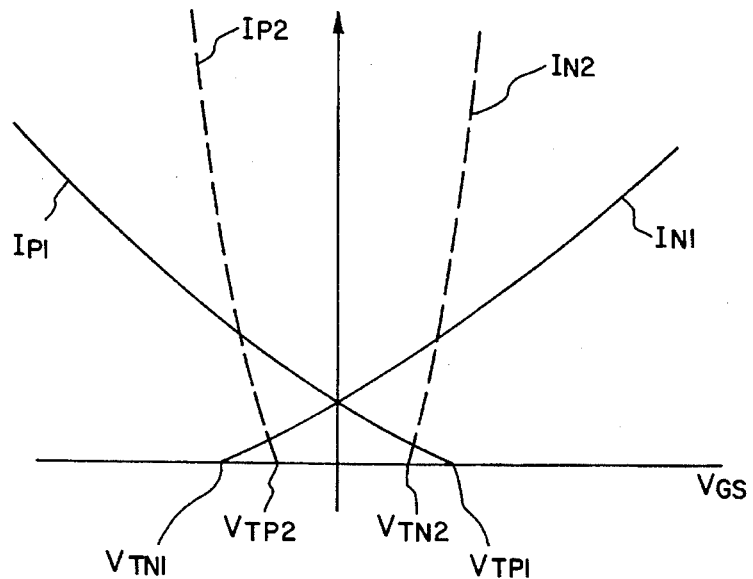
FIG. 29 is a graph showing the relationship between current flowing through the circuit of Embodiment 19 and $V_{GS}$.

The current flowing through each transistor is depicted in FIG. 29. As shown in FIG. 29, until $V_{out}$ approaches a value which is nearer to that of $V_{in}$, the transistors $N_2$ or $P_2$, which have large current driving abilities, are placed in ON states, so that it is possible to realize a further increase in speed in comparison with the case of Embodiment 18 shown in FIG. 27.

Embodiment 20

Figure 30:
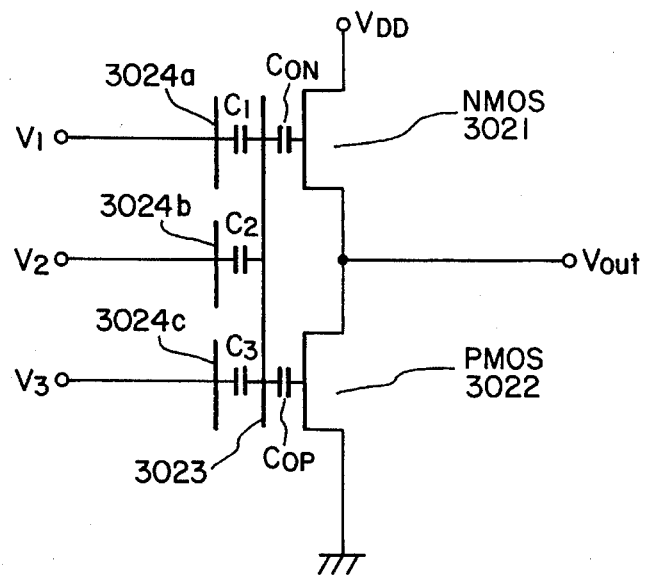
FIG. 30 is a conceptual diagram showing the circuit of Embodiment 20.

Embodiment 20 is depicted in FIG. 30. In the present Embodiment, a floating gate 3023 is used as the gate electrode of Embodiment 15 and this is provided along with control electrodes 3024a, 3024b, and 3024c which conduct capacitive coupling. If the input voltages into each control electrode are termed $V_1$, $V_2$, and $V_3$, then the potential $\phi_F$ of floating gate 3023 is such that $$\phi_F = \frac{C_1 V_1 + C_2 V_2 + C_3 V_3 + Q_F}{C_{TOT}} \quad (31)$$

Here, $$C_{TOT} = C_1 C_2 + C_3 + C_{OP} C_{ON}$$

$C_1$–$C_3$: capacitive coupling between control electrodes and the floating gate $C_{OP}$, $C_{ON}$: capacitive coupling coefficients between floating gates of the PMOS and NMOS portions and the substrate $Q_F$: total amount of the charge within the floating gate. For example, if $\beta_R = 1$, and $|V_{TN}| = V_{TP}$ are designated, then $$V_{out} = \phi_F = W_1 V_1 + W_2 V_2 + W_3 V_3 + Q_F/C_{TOT},$$

and $$W_i = C_i/C_{TOT}$$

results. Here, if $Q_F = 0$, then $$V_{out} = W_1 V_1 + W_2 V_2 + W_3 V_3$$

results, and it is possible to realize a circuit in which the linear sum of the input voltages is calculated.

Furthermore, by designating $Q_F \neq 0$, it is also possible to add an offset. In order to change $Q_F$, it is acceptable to impress high voltages on $V_1$, $V_2$, and $V_3$, to inject electrons passing through the gate oxide film or to discharge these.

Furthermore, if the capacitances of each capacitor in FIG. 30 are set so that $C_2=2C_1$, $C_3=2^2C_1$ (that is to say, $W_2=2W_1$, and $W_3=2^2W_1$) and the input voltages $V_1$, $V_2$, and $V_3$ are set so as to be two-value signals such that $V_i=X_iV_{DD}(X=1 \text{ or } 0)$, then $V_{out}$ is such that $$V_{out}=W_1V_{DD}(X_1+2X_2+2^2X_3),$$

and a circuit which conducts the D/A conversion of two 3-bit binary numbers is realized. In the same manner, it is possible to easily create an n-bit D/A conversion circuit.

Figure 31:
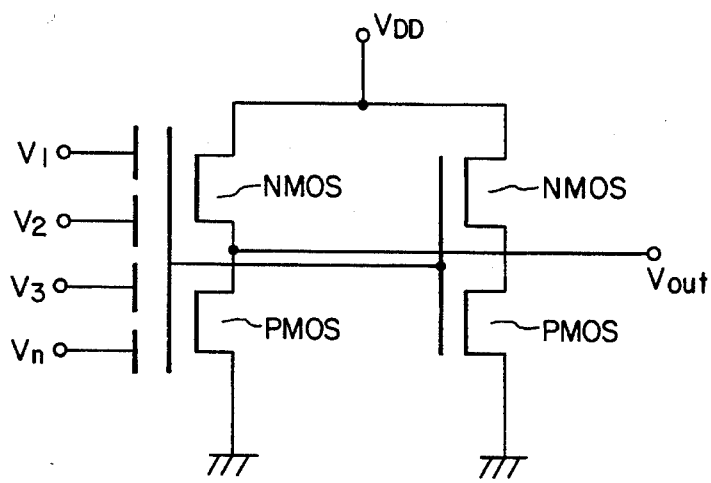
FIG. 31 is a conceptual diagram showing another circuit of Embodiment 20.

Furthermore, by adding a circuit having a large current driving ability to the circuit shown in FIG. 30, as shown in FIG. 31, in a manner identical to that of Embodiment 18, it is possible to achieve a further increase in circuit speed.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A source follower circuit comprising:

an NMOS transistor having a source and a floating gate;

a PMOS transistor having a source and a floating gate;

the source of said NMOS transistor connected to both the source of said PMOS transistor and to an output terminal;

the floating gate of said NMOS transistor connected to the floating gate of said PMOS transistor; and a plurality of input gates respectively capacitively coupled to said respective floating gates of said NMOS transistor and PMOS transistor and respectively connected to a plurality of input terminals.

* * * * *